US009104102B2

(12) United States Patent
Matsuda et al.

(10) Patent No.: US 9,104,102 B2
(45) Date of Patent: *Aug. 11, 2015

(54) RADIATION-SENSITIVE RESIN COMPOSITION

(75) Inventors: Yasuhiko Matsuda, Tokyo (JP); Takanori Kawakami, Tokyo (JP); Kazuki Kasahara, Tokyo (JP); Ken Maruyama, Tokyo (JP)

(73) Assignee: JSR CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/560,987

(22) Filed: Jul. 27, 2012

(65) Prior Publication Data
US 2012/0295198 A1 Nov. 22, 2012

Related U.S. Application Data

(63) Continuation of application No. PCT/JP2011/051335, filed on Jan. 25, 2011.

(30) Foreign Application Priority Data

Jan. 29, 2010 (JP) ................................. 2010-018466

(51) Int. Cl.
G03F 7/004 (2006.01)
G03F 7/039 (2006.01)
G03F 7/11 (2006.01)
G03F 7/20 (2006.01)

(52) U.S. Cl.
CPC ............ G03F 7/0045 (2013.01); G03F 7/0046 (2013.01); G03F 7/0397 (2013.01); G03F 7/11 (2013.01); G03F 7/2041 (2013.01)

(58) Field of Classification Search
None
See application file for complete search history.

(56) References Cited

U.S. PATENT DOCUMENTS

| 2008/0085469 | A1* | 4/2008 | Ohsawa et al. | 430/286.1 |
| 2008/0292989 | A1* | 11/2008 | Nishikawa | 430/287.1 |
| 2009/0104563 | A1* | 4/2009 | Ishiduka et al. | 430/285.1 |
| 2009/0162788 | A1* | 6/2009 | Hada et al. | 430/285.1 |
| 2010/0081088 | A1* | 4/2010 | Kawaue et al. | 430/285.1 |
| 2011/0217654 | A1* | 9/2011 | Yamato et al. | 430/270.1 |

FOREIGN PATENT DOCUMENTS

| JP | 2002-145955 | 5/2002 |
| JP | 2002-201232 | 7/2002 |
| JP | 2002-363123 | 12/2002 |
| JP | 2006162735 A * | 6/2006 |

(Continued)

OTHER PUBLICATIONS

Machine translation JP 2006-162735. Jun. 22, 2006.*
Wang et al. New Anionic Photoacid Generator Bound Polymer Resists for EUV Lithography. Oct. 18, 2007. ACS Macromolecules 2007, 40, 8220-8224.*
Office Action issued Sep. 26, 2014, in Taiwan Patent Application No. 100103434 filed Jan. 28, 2011 (with English-language Translation).
Office Action issued Jul. 1, 2014, in Japanese Patent Application No. 2011-551853 (w/ English-language Translation).

(Continued)

Primary Examiner — Cynthia H Kelly
Assistant Examiner — Alyssa L Cepluch
(74) Attorney, Agent, or Firm — Oblon, McClelland, Maier & Neustadt, L.L.P.

(57) ABSTRACT

A radiation-sensitive resin composition includes a compound represented by a following formula (1), and a first polymer that serves as a base resin. $R^1$ represents a monovalent alicyclic hydrocarbon group having 3 to 20 carbon atoms, or the like. The $M^+$ represents a monovalent cation. The first polymer (B) is preferably insoluble or hardly soluble in alkali, the polymer including a structure unit represented by a formula (5) or a structure unit represented by a formula (6), and a structure unit represented by a formula (7).

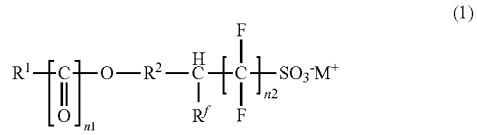

(1)

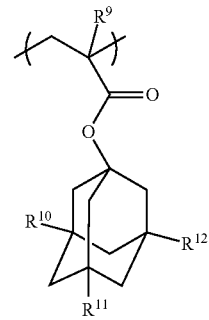

(5)

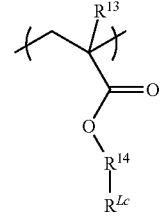

(6)

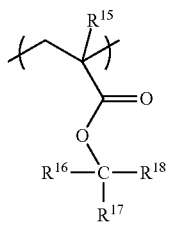

(7)

11 Claims, No Drawings

(56) References Cited

FOREIGN PATENT DOCUMENTS

| | | |
|---|---|---|
| JP | 2008-106045 | 5/2008 |
| JP | 2009-080474 | 4/2009 |
| JP | 2009-269953 | 11/2009 |
| JP | 2011-013479 | 1/2011 |
| JP | 2011-095700 | 5/2011 |
| TW | 200837049 A | 9/2008 |
| WO | WO 2008/047678 | 4/2008 |
| WO | WO 2009/051088 | 4/2009 |
| WO | WO 2011/093139 | 8/2011 |

OTHER PUBLICATIONS

International Search Report for International Application No. PCT/JP2011/051335, Feb. 22, 2011.

* cited by examiner

RADIATION-SENSITIVE RESIN COMPOSITION

CROSS-REFERENCE TO RELATED APPLICATIONS

The present application is a continuation application of International Application No. PCT/JP2011/051335, filed Jan. 25, 2011, which claims priority to Japanese Patent Application No. 2010-018466, filed Jan. 29, 2010. The contents of these applications are incorporated herein by reference in their entirety.

BACKGROUND OF THE INVENTION

1. Field of the Invention

The present invention relates to a radiation-sensitive resin composition.

2. Discussion of the Background

In the field of microfabrication typified by production of integrated circuit devices and the like, a lithography technique that allows for microfabrication at a level of no greater than about 100 nm using a radioactive ray such as a far ultraviolet ray such as a KrF excimer laser, an ArF excimer laser, an $F_2$ excimer laser or an EUV (extreme ultraviolet ray), or a charged particle-ray such as an electron beam has been required in order to attain a higher integrity.

As radiation-sensitive resin compositions suited for such radioactive rays, radiation-sensitive resin compositions in which a component having an acid-dissociable functional group and a chemical amplification effect by an acid generator are utilized were proposed. For example, a polymer compound for photoresist that contains as a polymer component a polymer having a monomer unit which includes a norbornane ring derivative has been known (see Japanese Unexamined Patent Application, Publication No. 2002-201232 and Japanese Unexamined Patent Application, Publication No. 2002-145955). In addition, for improving sensitivity and resolution, a radiation-sensitive resin composition to which a photoactive compound is further added has been known (see Japanese Unexamined Patent Application, Publication No. 2002-363123).

However, further enhanced integrity has been demanded in the field of semiconductors nowadays, and a radiation-sensitive resin composition that has well balanced LWR (i.e., Line Width Roughness) and MEEF (i.e., Mask Error Enhancement Factor), and resistance to pattern collapse after the development.

SUMMARY OF THE INVENTION

According to one aspect of the present invention, a radiation-sensitive resin composition includes a compound represented by a following formula (1), and a first polymer that serves as a base resin.

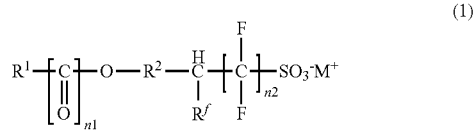

(1)

In the formula (1), $R^2$ represents an alkyl group having 1 to 20 carbon atoms, a monovalent alicyclic hydrocarbon group having 3 to 20 carbon atoms, an aryl group having 6 to 15 carbon atoms or a heteroaryl group having 4 to 15 carbon atoms; $R^2$ represents a bivalent linking group; $R^f$ represents a fluorine atom or a fluorinated alkyl group having 1 to 30 carbon atoms; $M^+$ represents a monovalent cation; and n1 and n2 are each independently 0 or 1.

DESCRIPTION OF THE EMBODIMENTS

An embodiment of the present invention which was made in order to solve the foregoing problems is directed to a radiation-sensitive resin composition including (A) a compound represented by the following formula (1) (hereinafter, may be also referred to as "compound (A)"), and (B) a polymer that serves as a base resin (hereinafter, may be also referred to as "polymer (B)").

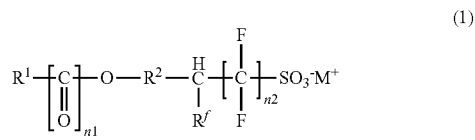

(1)

In the formula (1), $R^1$ represents an alkyl group having 1 to 20 carbon atoms, a monovalent alicyclic hydrocarbon group having 3 to 20 carbon atoms, an aryl group having 6 to 15 carbon atoms or a heteroaryl group having 4 to 15 carbon atoms; $R^2$ represents a bivalent linking group; $R^f$ represents a fluorine atom or a fluorinated alkyl group having 1 to 30 carbon atoms; $M^+$ represents a monovalent cation; and n1 and n2 are each independently 0 or 1.

The $R^1$ described above preferably represents a monovalent alicyclic hydrocarbon group having 3 to 20 carbon atoms.

The $M^+$ described above preferably represents a sulfonium cation or an iodonium cation.

The polymer (B) is preferably a polymer that is insoluble or hardly soluble in alkali, the polymer having a structure unit represented by the following formula (5) or a structure unit represented by the following formula (6), and a structure unit represented by the following formula (7):

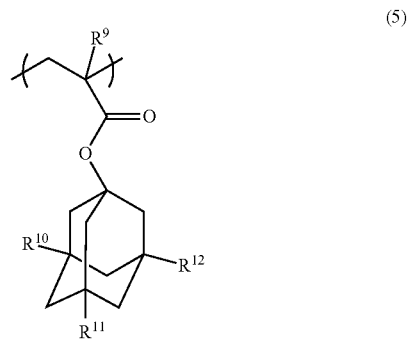

(5)

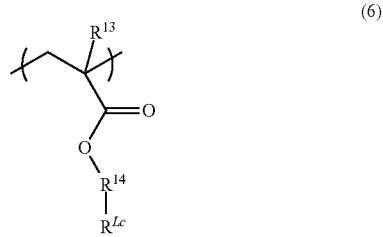

(6)

(7)

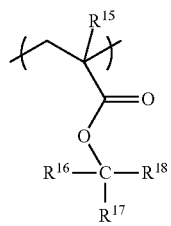

in the formula (5), formula (6) and formula (7), $R^9$, $R^{13}$ and $R^{15}$ each independently represent a hydrogen atom or a methyl group, in the formula (5), $R^{10}$, $R^{11}$ and $R^{12}$ each independently represent a hydrogen atom, a hydroxyl group, a cyano group or —COOR$^{19}$; and $R^{19}$ represents a hydrogen atom, a linear or branched alkyl group having 1 to 4 carbon atoms, or a cycloalkyl group having 3 to 20 carbon atoms, in the formula (6), $R^{14}$ represents a single bond or a bivalent linking group; $R^{Lc}$ represents a monovalent organic group having a lactone structure, and in the formula (7), $R^{16}$, $R^{17}$ and $R^{18}$ each independently represent a monovalent alicyclic hydrocarbon group having 4 to 20 carbon atoms or a derivative thereof, or a linear or branched alkyl group having 1 to 4 carbon atoms, wherein, at least one group of $R^{16}$, $R^{17}$ and $R^{18}$ represent an alicyclic hydrocarbon group having 4 to 20 carbon atoms or a derivative thereof, or any two groups thereof form a bivalent alicyclic hydrocarbon group having 4 to 20 carbon atoms or a derivative thereof together with the carbon atom to which they are each attached.

It is preferred that the radiation-sensitive resin composition further contains (C) a polymer having a content of fluorine atoms greater than the polymer (B) (hereinafter, may be also referred to as "polymer (C)").

It is to be noted that the "radioactive ray" used for radiation of the "radiation-sensitive resin composition" as referred to herein may include visible light rays, ultraviolet rays, far ultraviolet rays, X-rays, charged particle-rays, and the like.

According to the embodiment of the present invention, a radiation-sensitive resin composition having well balanced LWR and MEEF, and resistance to pattern collapse after the development can be provided. Therefore, the radiation-sensitive resin composition can be suitably used as a chemically amplified resist that is useful for microfabrication in which a radioactive ray such as a far ultraviolet ray such as a KrF excimer laser or an ArF excimer laser, an X-ray such as a synchrotron radioactive ray, or a charged particle-ray such as an electron beam is used. The embodiments will now be described.

Radiation-Sensitive Resin Composition

The radiation-sensitive resin composition of the embodiment of the present invention contains (A) a compound and (B) a polymer. In addition, (C) a polymer is contained as a preferable component. Moreover, other optional component may be contained in the range not to impair the effects of the invention. Hereinafter, each component is explained in detail.

(A) Compound

The compound (A) is represented by the above formula (1), and generates a compound represented by the following formula (1') upon irradiation with a radioactive ray.

(1')

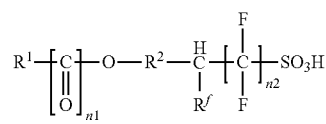

In the above formula (1) and formula (1'), $R^1$ represents an alkyl group having 1 to 20 carbon atoms, a monovalent alicyclic hydrocarbon group having 3 to 20 carbon atoms, an aryl group having 6 to 15 carbon atoms or a heteroaryl group having 4 to 15 carbon atoms; $R^2$ represents a bivalent linking group; $R^f$ represents a fluorine atom or a fluorinated alkyl group having 1 to 30 carbon atoms; and n1 and n2 are each independently 0 or 1.

In the above formula (1), $M^+$ represents a monovalent cation.

The $R^1$ described above preferably represents an alkyl group having 1 to 20 carbon atoms or a monovalent alicyclic hydrocarbon group having 3 to 20 carbon atoms. The $R^1$ described above is more preferably a monovalent alicyclic hydrocarbon group having 3 to 20 carbon atoms since the diffusion length of the acid generated (hereinafter, may be also referred to as "diffusion length") is appropriately suppressed, and more favorable development performances such as LWR and MEEF can be attained.

Examples of the alkyl group having 1 to 20 carbon atoms represented by the $R^1$ described above include a methyl group, an ethyl group, a 1-propyl group, a 2-propyl group, a 1-butyl group, a 2-butyl group, a 2-(2-methylpropyl) group, a 1-pentyl group, a 2-pentyl group, a 3-pentyl group, a 1-(2-methylbutyl) group, a 1-(3-methylbutyl) group, a 2-(2-methylbutyl) group, a 2-(3-methylbutyl) group, a neopentyl group, a 1-hexyl group, a 2-hexyl group, a 3-hexyl group, a 1-(2-methylpentyl) group, a 1-(3-methylpentyl) group, a 1-(4-methylpentyl) group, a 2-(2-methylpentyl) group, a 2-(3-methylpentyl) group, a 2-(4-methylpentyl) group, a 3-(2-methylpentyl) group, a 3-(3-methylpentyl) group, and the like.

Examples of the monovalent alicyclic hydrocarbon group having 3 to 20 carbon atoms represented by the $R^1$ described above include a cyclopentyl group, a cyclohexyl group, a cycloheptyl group, a 2-norbornyl group, a 1-adamantyl group, a 2-adamantyl group, and the like. Of these, a cyclohexyl group, and a 1-adamantyl group are preferred.

Furthermore, a part or all of hydrogen atoms may be substituted in the $R^1$. Examples of the substituent include a cyano group, a halogen atom (a fluorine atom, a chlorine atom, a bromine atom, etc.), a phenyl group, a hydroxyl group, an acyloxy group, an alkoxy group, and the like.

The bivalent linking group represented by the $R^2$ described above is exemplified by at least one selected from the group consisting of an ether group, an ester group, a carbonyl group, a bivalent chain hydrocarbon group having 1 to 30 carbon atoms, a bivalent cyclic hydrocarbon group having 3 to 30 carbon atoms, a bivalent aromatic hydrocarbon group having 6 to 30 carbon atoms, or a group derived by combining two or more thereof, and the like.

The $R^2$ described above is more preferably a bivalent chain hydrocarbon group having 1 to 30 carbon atoms, a bivalent cyclic hydrocarbon group having 3 to 30 carbon atoms, or a bivalent aromatic hydrocarbon group having 6 to 30 carbon atoms are preferred, and more preferably a linear or branched bivalent hydrocarbon group having 1 to 10 carbon atoms.

The fluorinated alkyl group having 1 to 30 carbon atoms represented by the $R^f$ described above is exemplified by a linear or branched alkyl group having 1 to 6 carbon atoms substituted with at least one or more fluorine atoms, a monovalent alicyclic hydrocarbon group having 4 to 20 carbon atoms substituted with at least one or more fluorine atoms, or a group derived therefrom, and the like. $R^f$ is preferably a fluorine atom or a trifluoromethyl group.

The linear or branched alkyl group having 1 to 6 carbon atoms substituted with at least one or more fluorine atoms is exemplified by partially fluorinated or perfluoroalkyl groups such as e.g., a methyl group, an ethyl group, a 1-propyl group, a 2-propyl group, a 1-butyl group, a 2-butyl group, a 2-(2-methylpropyl) group, a 1-pentyl group, a 2-pentyl group, a 3-pentyl group, a 1-(2-methylbutyl) group, a 1-(3-methylbutyl) group, a 2-(2-methylbutyl) group, a 2-(3-methylbutyl) group, a neopentyl group, a 1-hexyl group, a 2-hexyl group, a 3-hexyl group, a 1-(2-methylpentyl) group, a 1-(3-methylpentyl) group, a 1-(4-methylpentyl) group, a 2-(2-methylpentyl) group, a 2-(3-methylpentyl) group, a 2-(4-methylpentyl) group, a 3-(2-methylpentyl) group and a 3-(3-methylpentyl) group, and the like.

The monovalent alicyclic hydrocarbon group having 4 to 20 carbon atoms substituted with at least one or more fluorine atoms, or a group derived therefrom is exemplified by partially fluorinated or perfluoroalkyl groups of an alicyclic alkyl group such as e.g., a cyclopentyl group, a cyclopentylmethyl group, a 1-(1-cyclopentylethyl) group, a 1-(2-cyclopentylethyl) group, a cyclohexyl group, a cyclohexylmethyl group, a 1-(1-cyclohexylethyl) group, a 1-(2-cyclohexylethyl) group), a cycloheptyl group, a cycloheptyl methyl group, a 1-(1-cycloheptyl ethyl) group, a 1-(2-cycloheptyl ethyl) group or a 2-norbornyl group, and the like.

The monovalent cation represented by the M⁺ described above is not particularly limited, and preferably represents a sulfonium cation or an iodonium cation.

When the monovalent cation represented by M⁺ is a sulfonium cation, the compound (A) may include a sulfonium salt represented by the following formula (2):

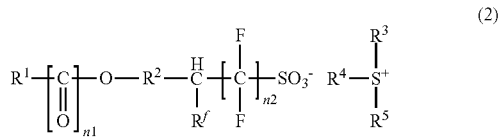

(2)

In the above formula (2), $R^1$, $R^2$, $R^f$, n1 and n2 are as defined in connection with the above formula (1); $R^3$, $R^4$ and $R^5$ each independently represent a linear or branched alkyl group, an alkenyl group or an oxoalkyl group having 1 to 10 carbon atoms, an aryl group, an aralkyl group or an aryloxoalkyl group having 6 to 18 carbon atoms, wherein, a part or all of hydrogen atoms of these groups may be substituted, also any two or more of $R^3$, $R^4$ and $R^5$ may bind to one another to form a ring structure together with the sulfur atom to which they are each attached.

The sulfonium cation is preferably a sulfonium cation represented by the following formula (2-1) or formula (2-2):

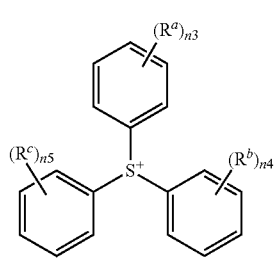

(2-1)

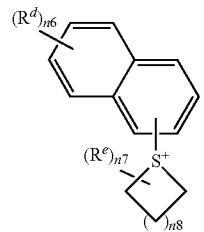

(2-2)

In the above formula (2-1), $R^a$, $R^b$ and $R^c$ each independently represent a hydrogen atom, a linear or branched alkyl group having 1 to 12 carbon atoms, an aryl group having 6 to 12 carbon atoms, or a monovalent alicyclic hydrocarbon group having 3 to 20 carbon atoms, wherein, a part or all of hydrogen atoms of these groups may be substituted; n3, n4 and n5 are each independently an integer of 0 to 5, wherein, provided that $R^a$, $R^b$ and $R^c$ are each present in a plurality of number, the $R^a$, $R^b$ and $R^c$ present in a plurality of number may be each the same or different, and In the above formula (2-2), $R^d$ represents a hydrogen atom, a linear or branched alkyl group having 1 to 8 carbon atoms, an aryl group having 6 to 8 carbon atoms, or a monovalent alicyclic hydrocarbon group having 3 to 20 carbon atoms, wherein, a part or all of hydrogen atoms of these groups may be substituted. n6 is an integer of 0 to 7, wherein, provided that $R^d$ is present in a plurality of number, the $R^d$ present in a plurality of number may be the same or different; $R^e$ represents a hydrogen atom, a linear or branched alkyl group having 1 to 7 carbon atoms, an aryl group having 6 to 7 carbon atoms, or a monovalent alicyclic hydrocarbon group having 3 to 20 carbon atoms; n7 is an integer of 0 to 5, wherein, provided that $R^e$ is present in a plurality of number, the $R^e$ present in a plurality of number may be the same or different; and n8 is an integer of 0 to 3.

The sulfonium cation represented by the above formula (2-1) and formula (2-2) is exemplified by sulfonium cations represented by the following formula (i-1) to formula (i-65), and the like.

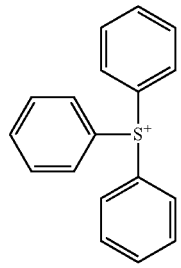

(i-1)

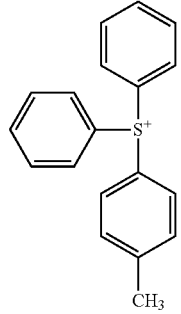

(i-2)

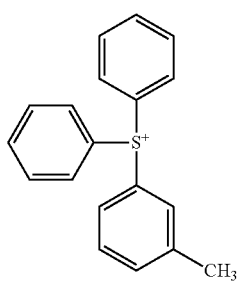 (i-3)
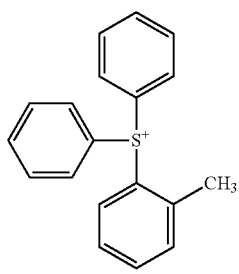 (i-4)
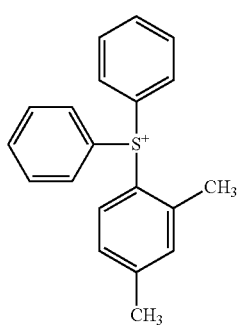 (i-5)
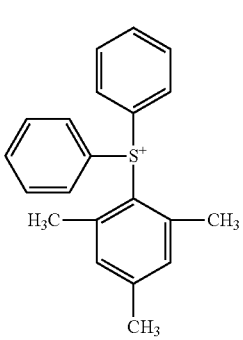 (i-6)
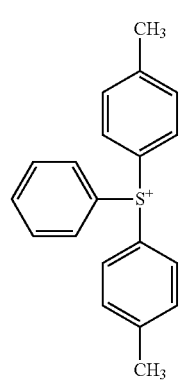 (i-7)
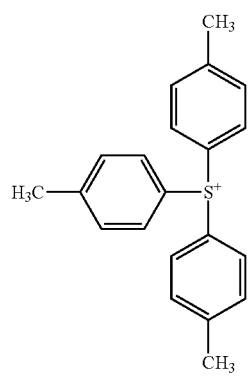 (i-8)
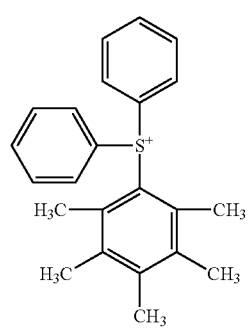 (i-9)
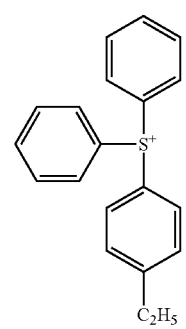 (i-10)
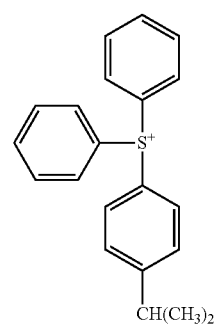 (i-11)

(i-12)
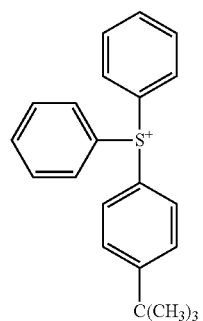
(i-13)
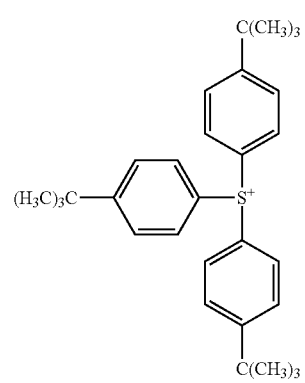
(i-14)
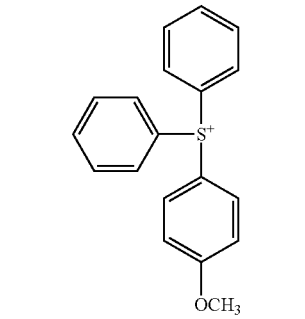
(i-15)
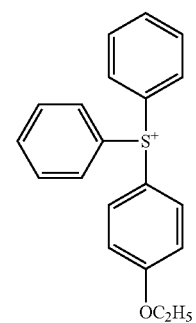
(i-16)
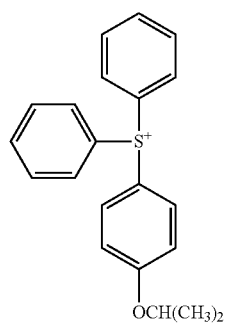
(i-17)
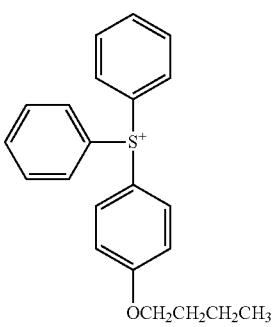
(i-18)
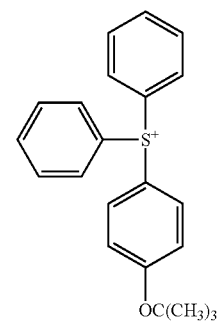
(i-19)
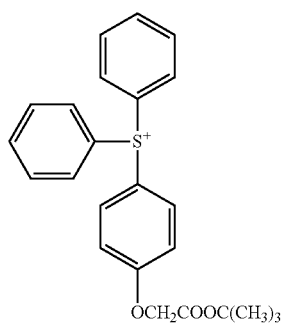

(i-20)
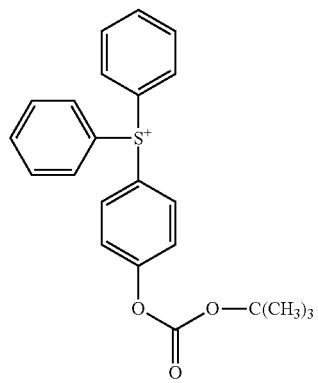
(i-21)
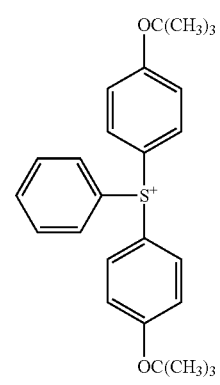
(i-22)
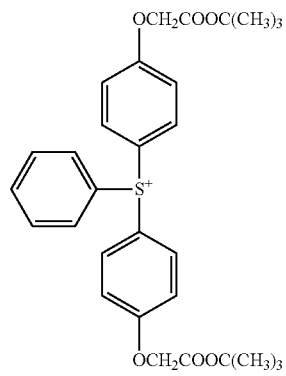
(i-23)
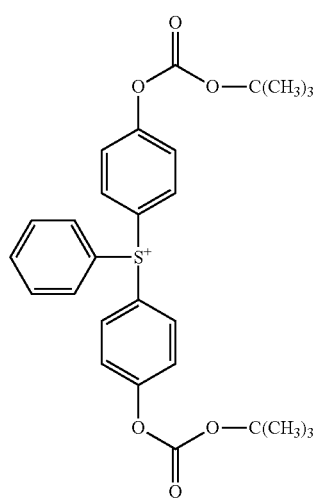
(i-24)
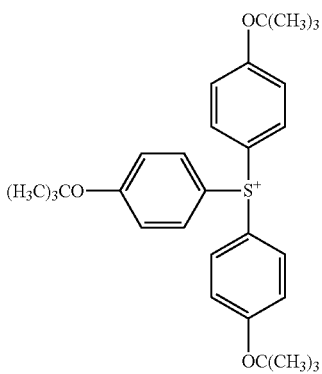
(i-25)
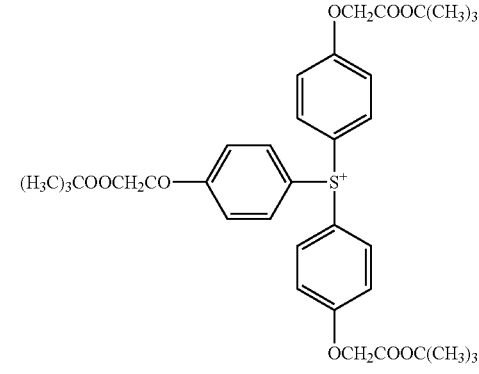
(i-26)
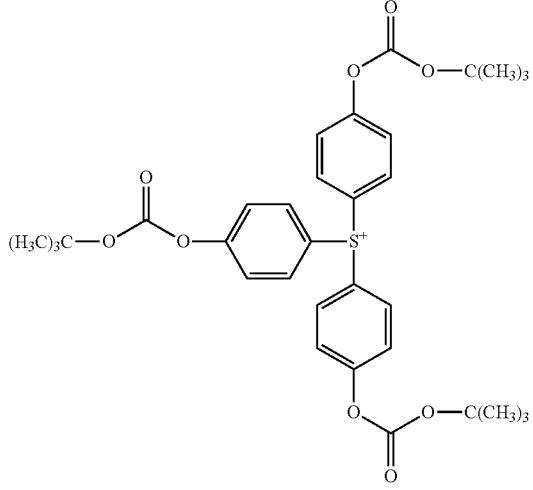
(i-27)
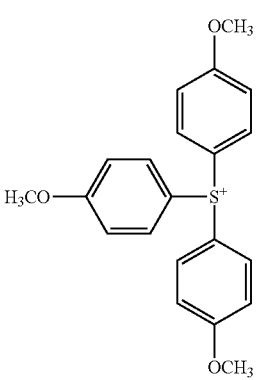

(i-28)
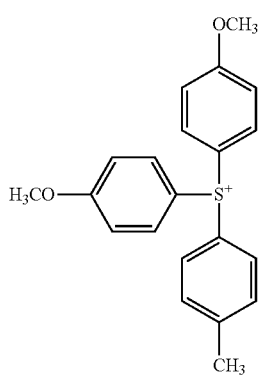
(i-29)
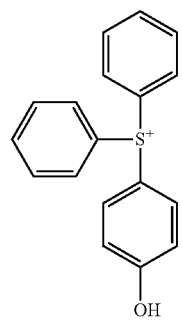
(i-30)
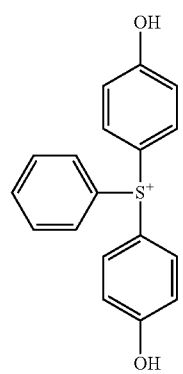
(i-31)
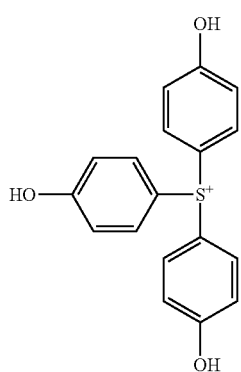
(i-32)
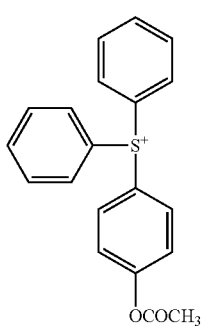
(i-33)
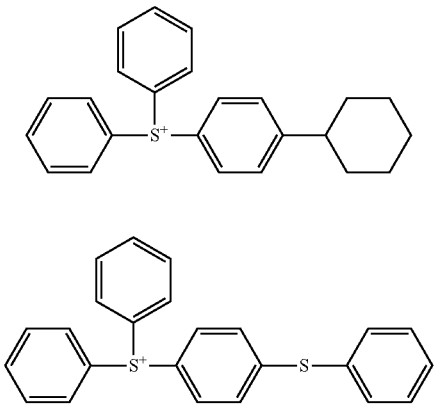
(i-34)
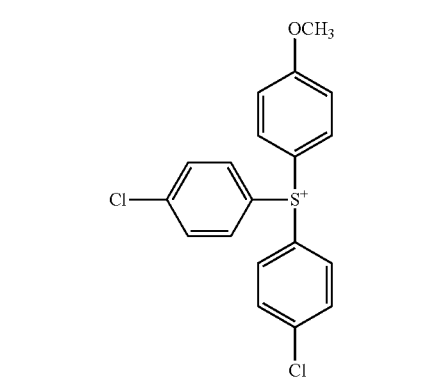
(i-35)
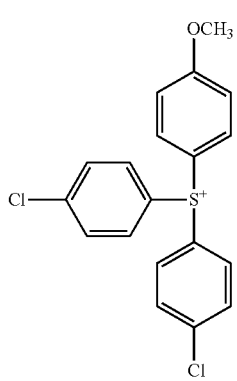
(i-36)
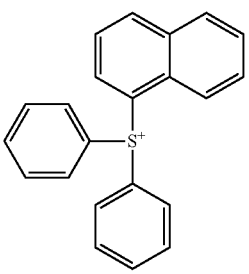
(i-37)
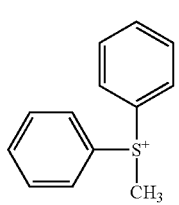

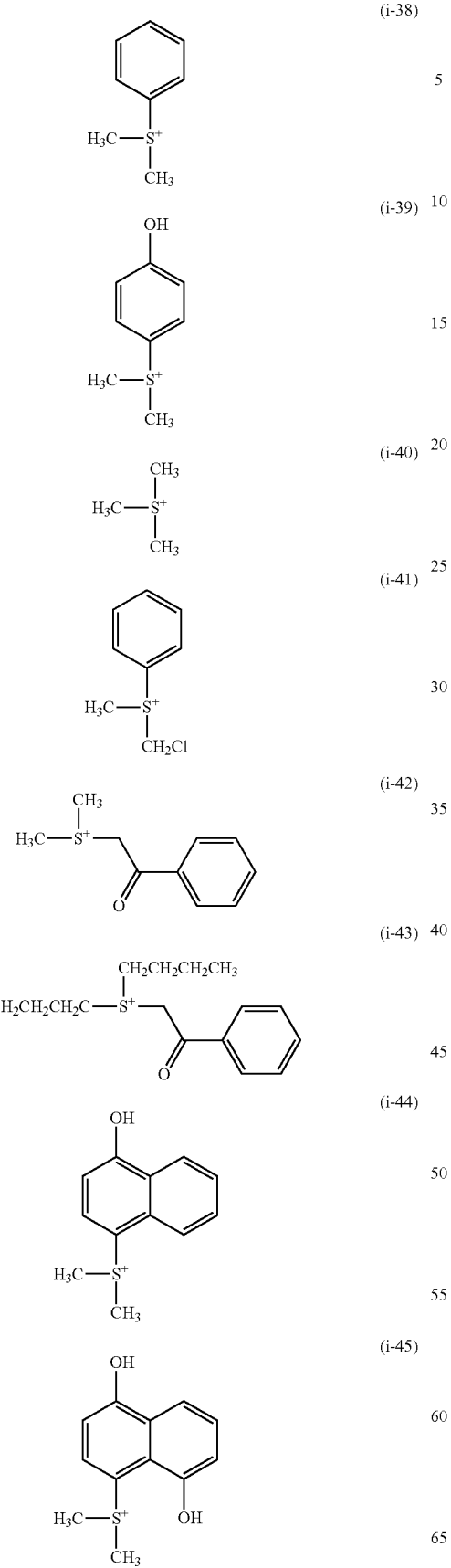
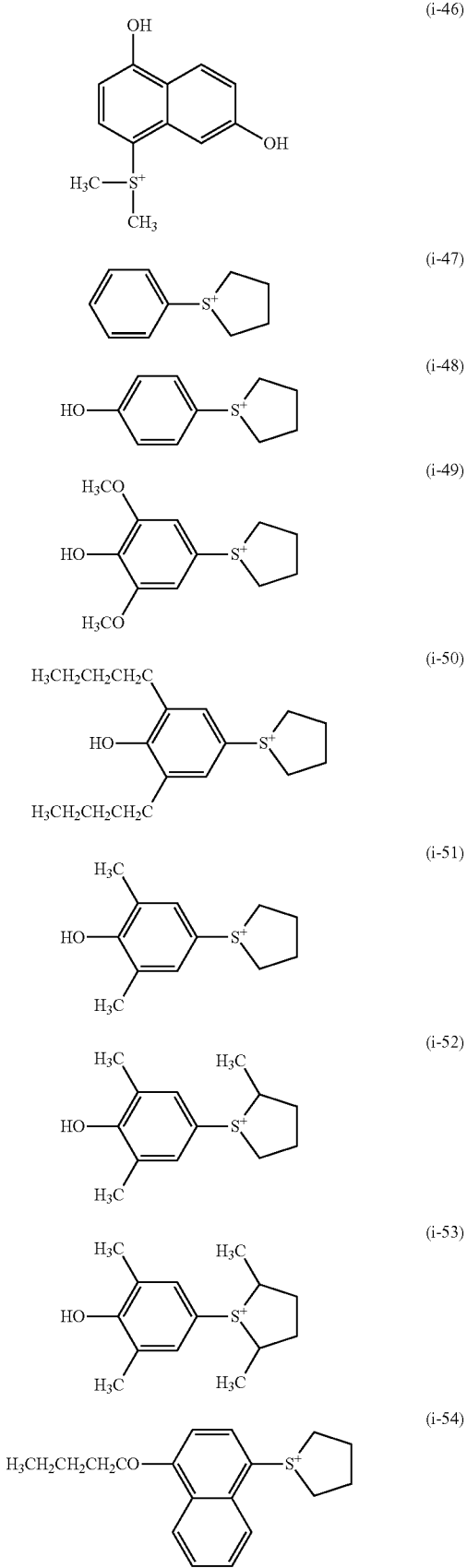

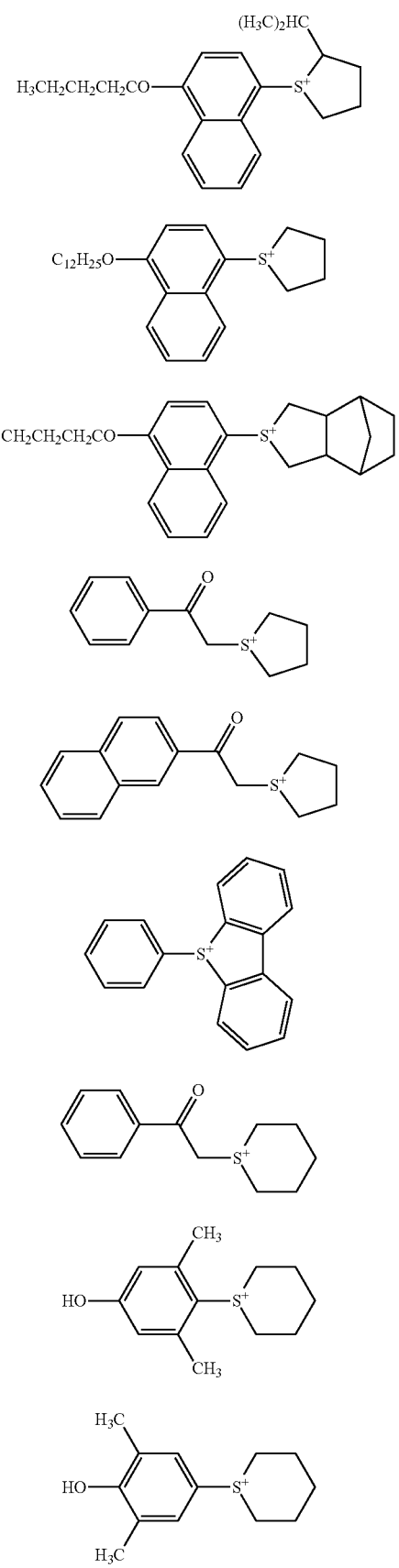

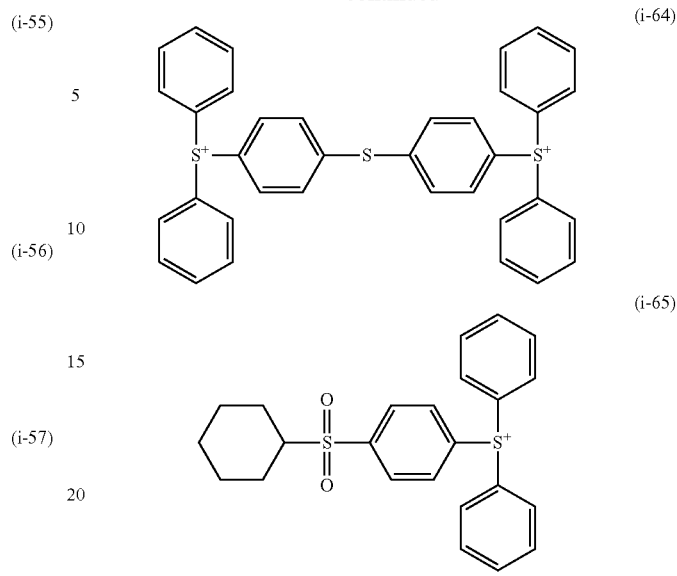

Of these, the sulfonium cations represented by the above formula (i-1), formula (i-2), formula (i-6), formula (i-8), formula (i-13), formula (i-19), formula (i-25), formula (i-27), formula (i-29), formula (i-33), formula (i-51), formula (i-54) and formula (i-65) are preferred.

When the monovalent cation represented by M⁺ is an iodonium cation, the compound (A) may include an iodonium salt represented by the following formula (3):

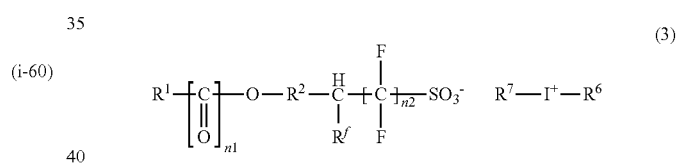

in the above formula (3), $R^1$, $R^2$, $R^f$, n1 and n2 are as defined in connection with the above formula (1); and $R^6$ and $R^7$ are as defined in connection with $R^3$ and $R^4$, respectively, in the above formula (2).

The iodonium cation is preferably an iodonium cation represented by the following formula (3-1):

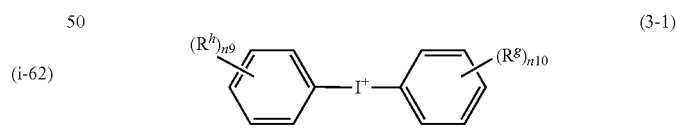

in the above formula (3-1), $R^h$ and $R^g$ each independently represent a hydrogen atom, a linear or branched alkyl group having 1 to 12 carbon atoms, an aryl group having 6 to 12 carbon atoms, or a monovalent alicyclic hydrocarbon group having 3 to 20 carbon atoms; and n9 and n10 are each independently an integer of 0 to 5, wherein, provided that $R^g$ and $R^h$ are each present in a plurality of number, the $R^g$ and $R^h$ present in a plurality of number may be each the same or different.

The iodonium cation represented by the above formula (3-1) is exemplified by iodonium cations represented by the following formula (ii-1) to formula (i-39), and the like.

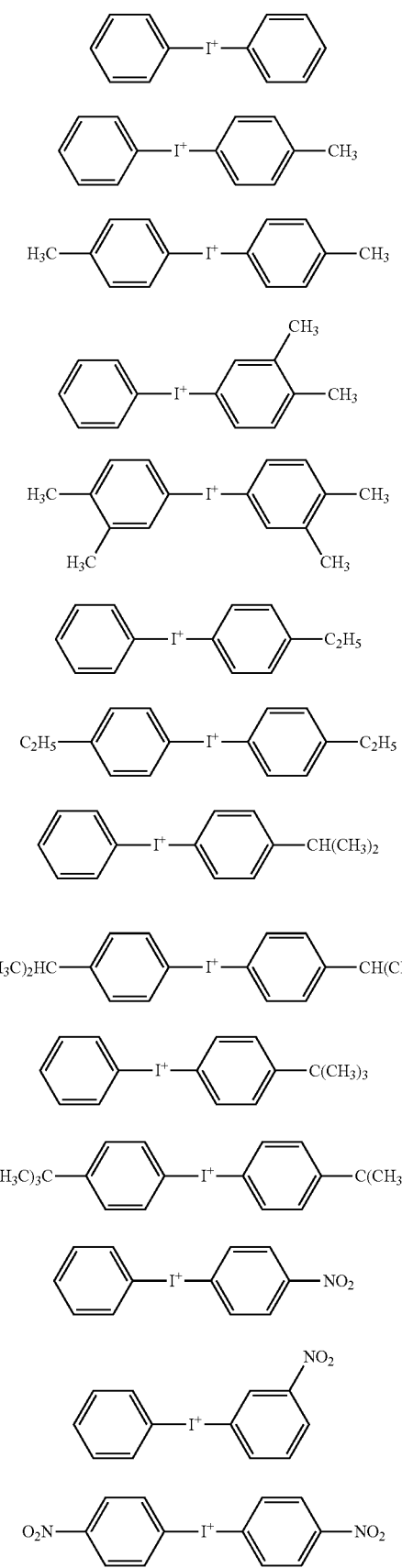
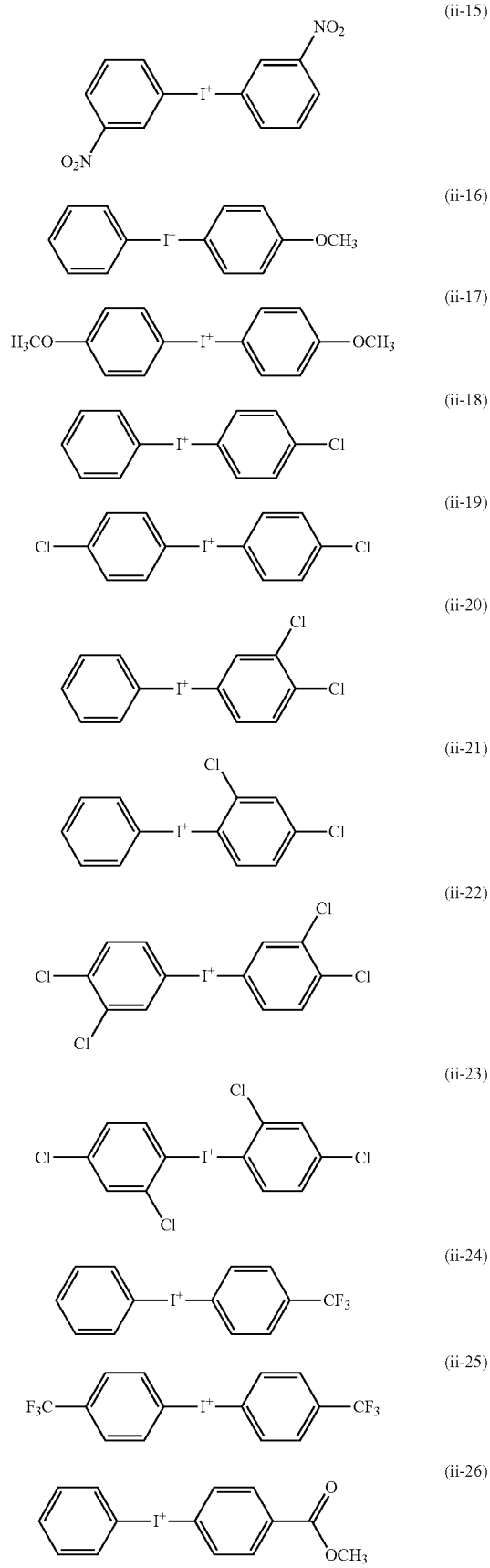

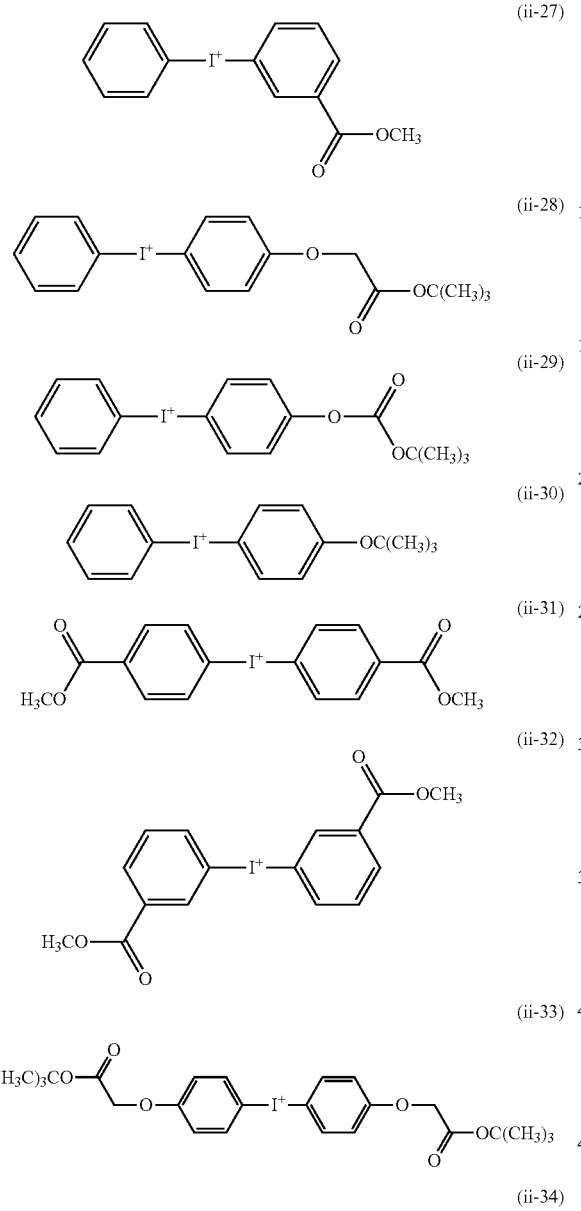
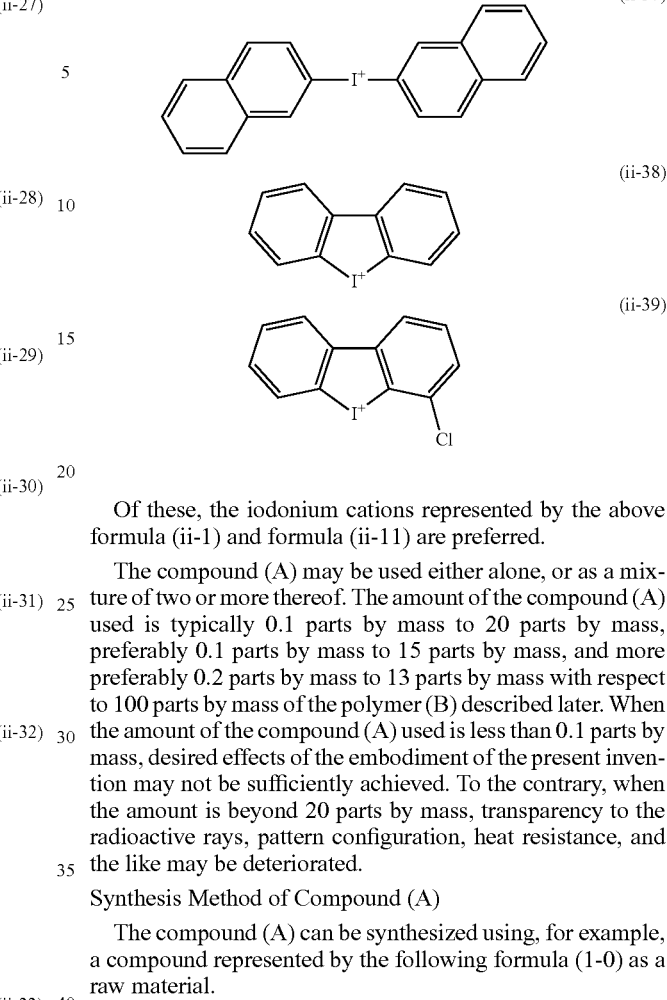

Of these, the iodonium cations represented by the above formula (ii-1) and formula (ii-11) are preferred.

The compound (A) may be used either alone, or as a mixture of two or more thereof. The amount of the compound (A) used is typically 0.1 parts by mass to 20 parts by mass, preferably 0.1 parts by mass to 15 parts by mass, and more preferably 0.2 parts by mass to 13 parts by mass with respect to 100 parts by mass of the polymer (B) described later. When the amount of the compound (A) used is less than 0.1 parts by mass, desired effects of the embodiment of the present invention may not be sufficiently achieved. To the contrary, when the amount is beyond 20 parts by mass, transparency to the radioactive rays, pattern configuration, heat resistance, and the like may be deteriorated.

Synthesis Method of Compound (A)

The compound (A) can be synthesized using, for example, a compound represented by the following formula (1-0) as a raw material.

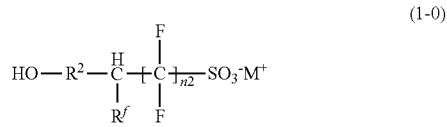

(1-0)

In the above formula (1-0), $R^2$, $R^f$, n2 and $M^+$ are as defined in connection with the above formula (1). Among the compounds represented by the above formula (1-0), the compound in which n2 is 1 can be synthesized by, for example, a method described in Journal of Fluorine Chemistry, 129 (2008), 607. The compound in which n2 is 0 can be synthesized by, for example, a method described in Journal of Fluorine Chemistry, 129 (2008), 607 using the compound represented by the following formula (1-0') as a raw material.

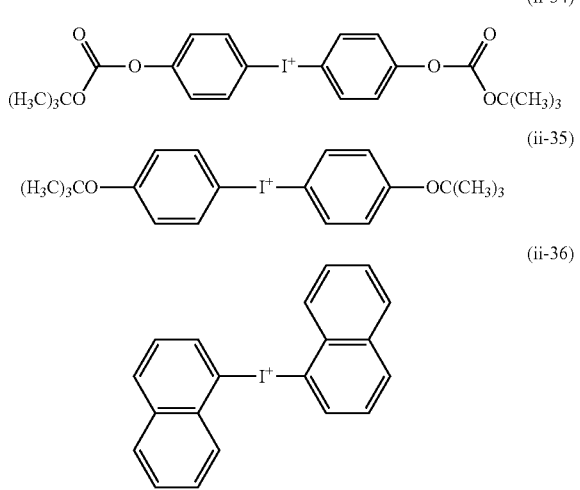

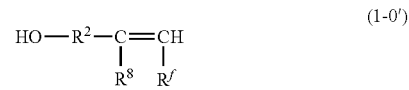

(1-0')

In the above formula (1-0'), $R^2$ and $R^f$ are as defined in connection with the above formula (1); and $R^8$ represents a monovalent organic group.

With regard to the compound represented by the above formula (1-0), the compound represented by the formula (1) can be obtained by allowing, for example, the following reaction to be caused.

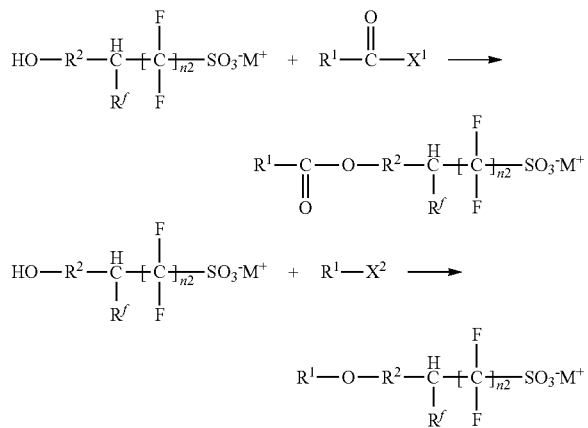

In the reaction formula, $R^1$, $R^2$, $R^f$, n2 and $M^+$ are as defined in connection with the above formula (1); $X^1$ represents a hydroxyl group, a halogen atom or O—CO—$R^1$; and $X^2$ represents a halogen atom.

In the radiation-sensitive resin composition, one or more types of a radiation-sensitive compound (hereinafter, may be also referred to as "other radiation-sensitive compound") other than the compound (A) may be used. The other radiation-sensitive compound is exemplified by an onium salt compound, a sulfone compound, a sulfonic acid esterified compounds, a sulfonimide compound, a diazomethane compound, a disulfonylmethane compound, an oxime sulfonate compound, a hydrazine sulfonate compound, and the like.

Examples of the other radiation-sensitive compound include diphenyliodonium trifluoromethanesulfonate, diphenyliodonium nonafluoro-n-butanesulfonate, diphenyliodonium p-toluenesulfonate, diphenyliodonium 10-camphorsulfonate, diphenyliodonium 2-trifluoromethylbenzenesulfonate, diphenyliodonium 4-trifluoromethylbenzenesulfonate, diphenyliodonium 2,4-difluorobenzenesulfonate, diphenyliodonium 1,1,2,2-tetrafluoro-2-(norbornan-2-yl)ethanesulfonate, diphenyliodonium 2-(5-t-butoxycarbonyloxybicyclo[2.2.1]heptan-2-yl)-1,1,2,2-tetrafluoroethanesulfonate, diphenyliodonium 2-(6-t-butoxycarbonyloxybicyclo[2.2.1]heptan-2-yl)-1,1,2,2-tetrafluoroethanesulfonate, diphenyliodonium 1,1-difluoro-2-(bicyclo[2.2.1]heptan-2-yl)ethanesulfonate, bis(4-t-butylphenyl)iodonium trifluoromethanesulfonate, bis(4-t-butylphenyl)iodonium nonafluoro-n-butanesulfonate, bis(4-t-butylphenyl)iodonium p-toluenesulfonate, bis(4-t-butylphenyl)iodonium 10-camphorsulfonate, bis(4-t-butylphenyl)iodonium 2-trifluoromethylbenzenesulfonate, bis(4-t-butylphenyl)iodonium 4-trifluoromethylbenzenesulfonate, bis(4-t-butylphenyl)iodonium 2,4-difluorobenzenesulfonate, bis(4-t-butylphenyl)iodonium 1,1,2,2-tetrafluoro-2-(norbornan-2-yl)ethanesulfonate, bis(4-t-butylphenyl)iodonium 1,1-difluoro-2-(bicyclo[2.2.1]heptan-2-yl)ethanesulfonate, triphenylsulfonium trifluoromethanesulfonate, triphenylsulfonium nonafluoro-n-butanesulfonate, triphenylsulfonium p-toluenesulfonate, triphenylsulfonium 10-camphorsulfonate, triphenylsulfonium 2-trifluoromethylbenzenesulfonate, triphenylsulfonium 4-trifluoromethylbenzenesulfonate, triphenylsulfonium 2,4-difluorobenzenesulfonate, triphenylsulfonium 1,1,2,2-tetrafluoro-2-(norbornan-2-yl)ethanesulfonate, triphenylsulfonium 2-(5-t-butoxycarbonyloxybicyclo[2.2.1]heptan-2-yl)-1,1,2,2-tetrafluoroethanesulfonate, triphenylsulfonium 2-(6-t-butoxycarbonyloxybicyclo[2.2.1]heptan-2-yl)-1,1,2,2-tetrafluoroethanesulfonate, triphenylsulfonium 2-(5-pivaloyloxybicyclo[2.2.1]heptan-2-yl)-1,1,2,2-tetrafluoroethanesulfonate, triphenylsulfonium 2-(6-pivaloyloxybicyclo[2.2.1]heptan-2-yl)-1,1,2,2-tetrafluoroethanesulfonate, triphenylsulfonium 2-(5-hydroxybicyclo[2.2.1]heptan-2-yl)-1,1,2,2-tetrafluoroethanesulfonate, triphenylsulfonium 2-(6-hydroxybicyclo[2.2.1]heptan-2-yl)-1,1,2,2-tetrafluoroethanesulfonate, triphenylsulfonium 2-(5-methanesulfonyloxybicyclo[2.2.1]heptan-2-yl)-1,1,2,2-tetrafluoroethanesulfonate, triphenylsulfonium 2-(6-methanesulfonyloxybicyclo[2.2.1]heptan-2-yl)-1,1,2,2-tetrafluoroethanesulfonate, triphenylsulfonium 2-(5-i-propanesulfonyloxybicyclo[2.2.1]heptan-2-yl)-1,1,2,2-tetrafluoroethanesulfonate, triphenylsulfonium 2-(6-i-propanesulfonyloxybicyclo[2.2.1]heptan-2-yl)-1,1,2,2-tetrafluoroethanesulfonate, triphenylsulfonium 2-(5-n-hexanesulfonyloxybicyclo[2.2.1]heptan-2-yl)-1,1,2,2-tetrafluoroethanesulfonate, triphenylsulfonium 2-(6-n-hexanesulfonyloxybicyclo[2.2.1]heptan-2-yl)-1,1,2,2-tetrafluoroethanesulfonate, triphenylsulfonium 2-(5-oxobicyclo[2.2.1]heptan-2-yl)-1,1,2,2-tetrafluoroethanesulfonate, triphenylsulfonium 2-(6-oxobicyclo[2.2.1]heptan-2-yl)-1,1,2,2-tetrafluoroethanesulfonate, triphenylsulfonium 1,1-difluoro-2-(bicyclo[2.2.1]heptan-2-yl)ethanesulfonate, 1-(4-n-butoxynaphthalen-1-yl)tetrahydrothiophenium trifluoromethanesulfonate, 1-(4-n-butoxynaphthalen-1-yl) tetrahydrothiophenium nonafluoro-n-butanesulfonate, 1-(4-n-butoxynaphthalen-1-yl)tetrahydrothiophenium 1,1,2,2-tetrafluoro-2-(norbornan-2-yl)ethanesulfonate, 1-(4-n-butoxynaphthalen-1-yl)tetrahydrothiophenium 2-(5-t-butoxycarbonyloxybicyclo[2.2.1]heptan-2-yl)-1,1,2,2-tetrafluoroethanesulfonate, 1-(4-n-butoxynaphthalen-1-yl)tetrahydrothiophenium 2-(6-t-butoxycarbonyloxybicyclo[2.2.1]heptan-2-yl)-1,1,2,2-tetrafluoroethanesulfonate, 1-(4-n-butoxynaphthalen-1-yl)tetrahydrothiophenium 1,1-difluoro-2-(bicyclo[2.2.1]heptan-2-yl)ethanesulfonate, N-(trifluoromethanesulfonyloxy)succinimido, N-(10-camphorsulfonyloxy)succinimido, N-[(5-methyl-5-carboxymethylbicyclo[2.2.1]heptan-2-yl)sulfonyloxy]succinimido, N-(trifluoromethanesulfonyloxy)bicyclo[2.2.1]hept-5-ene-2,3-dicarboxyimide, N-(nonafluoro-n-butanesulfonyloxy)bicyclo[2.2.1]hept-5-ene-2,3-dicarboxyimide, N-[1,1,2,2-tetrafluoro-2-(norbornan-2-yl)ethanesulfonyloxy]bicyclo[2.2.1]hept-5-ene-2,3-dicarboxyimide, N-(10-camphorsulfonyloxy)bicyclo[2.2.1]hept-5-ene-2,3-dicarboxyimide, N-[2-(5-oxobicyclo[2.2.1]heptan-2-yl)-1,1,2,2-tetrafluoroethanesulfonyloxy]bicyclo[2.2.1]hept-5-ene-2,3-dicarboxyimide, N-[2-(6-oxobicyclo[2.2.1]heptan-2-yl)-1,1,2,2-tetrafluoroethanesulfonyloxy]bicyclo[2.2.1]hept-5-ene-2,3-dicarboxyimide, N-[1,1-difluoro-2-(bicyclo[2.2.1]heptan-2-yl)ethanesulfonyloxy]bicyclo[2.2.1]hept-5-ene-2,3-dicarboxyimide, bis(cyclohexanesulfonyl)diazomethane, bis(t-butylsulfonyl)diazomethane, bis(1,4-dioxaspiro[4.5]decane-7-sulfonyl)diazomethane, compounds disclosed in paragraph nos. [0086] to [0113] of WO2009/051088, and the like.

The other radiation-sensitive compound is preferably an onium salt compound, a sulfonimide compound and a diazomethane compound.

The amount of the other radiation-sensitive compound used is typically no greater than 95 parts by mass, preferably no greater than 90 parts by mass, and more preferably no greater than 80 parts by mass with respect to 100 parts by mass of the total amount of the compound (A) and the other radiation-sensitive compound. When the amount of the other radiation-sensitive compound used is beyond 95 parts by mass, desired effects of the embodiment of the present invention may be impaired.

(B) Polymer

The polymer (B) serves as a base resin of the radiation-sensitive resin composition. Such a polymer may include, for example, a polymer that has an acid-dissociable group and that is insoluble or hardly soluble in alkali, and becomes easily soluble in alkali upon dissociation of the acid-dissociable group (hereinafter, may be also referred to as "(B1) polymer"); or a polymer that has one or more functional groups having affinity with the alkaline developer, for example, an oxygen-containing functional group such as a phenolic hydroxyl group, an alcoholic hydroxyl group or a carboxyl group, and thus that is soluble in an alkaline developer (hereinafter, may be also referred to as "(B2) polymer"). The radiation-sensitive resin composition containing the polymer (B1) can be suitably used as a positive type radiation-sensitive resin composition, whereas the radiation-sensitive resin composition containing the polymer (B2) can be suitably used as a negative type radiation-sensitive resin composition.

It is to be noted that, the phrase "insoluble or hardly soluble in alkali" as referred to means a property that in a case in which a coating film produced using only an acid-dissociable group-containing polymer is developed in place of a resist film under alkali development conditions employed in a resist pattern formation step, no less than 50% of the initial film thickness of the coating film remains after the development.

When the polymer (B) is used in combination with the polymer (C) described later, the content of fluorine atoms included in the polymer (B) is typically less than 5% by mass, preferably 0% by mass to 4.9% by mass, and more preferably 0% by mass to 4% by mass with respect to 100% by mass of the entirety of the fluorine-containing polymer. Note that the content of fluorine atoms can be determined by $^{13}$C-NMR. When the content of fluorine atoms in the polymer (B) falls within the range described above, water repellency of the surface of the resist film formed from the radiation-sensitive resin composition containing the polymer (B) and the polymer (C) can be improved, whereby necessity of separately forming an upper layer film in liquid immersion lithography can be obviated.

(B1) Polymer

The acid-dissociable group is a group derived by substituting a hydrogen atom in an acidic functional group such as, for example, a phenolic hydroxyl group, a carboxyl group or a sulfonic acid group with a substituent, and means a group that dissociates in the presence of an acid. Examples of the acid-dissociable group include substituted methyl groups, 1-substituted ethyl groups, 1-substituted-n-propyl groups, acyl groups, a cyclic acid-dissociable group, and the like.

The substituted methyl group is exemplified by groups described in paragraph no. [0117] of WO2009/051088, and the like. The 1-substituted ethyl group is exemplified by groups described in paragraph no. [0118] of WO2009/051088, and the like. The 1-substituted-n-propyl group is exemplified by groups described in paragraph no. [0119] of WO2009/051088, and the like. The acyl group is exemplified by groups described in paragraph no. [0120] of WO2009/051088, and the like. The cyclic acid-dissociable group is exemplified by groups described in paragraph no. [0121] of WO2009/051088, and the like.

Among these acid-dissociable groups, a benzyl group, a t-butoxycarbonyl methyl group, a 1-methoxyethyl group, a 1-ethoxyethyl group, a 1-cyclohexyloxyethyl group, a 1-ethoxy-n-propyl group, a t-butyl group, a 1,1-dimethylpropyl group, a t-butoxycarbonyl group, a tetrahydropyranyl group, a tetrahydrofuranyl group, a tetrahydrothiopyranyl group, and a tetrahydrothiofuranyl group are preferred. In the polymer (B1), one or more of the acid-dissociable groups may be present.

The percentage introduction of the acid-dissociable group in the polymer (B1), i.e., rate of number of acid-dissociable group to the total number of acidic functional group and the acid-dissociable group in the proportion polymer (B1), may be appropriately selected depending on the type of the acid-dissociable group and the polymer into which the acid-dissociable group is introduced, and is preferably 5% to 100% and more preferably 10% to 100%.

The structure of the polymer (B1) is not particularly limited as long as the properties described above are provided. The polymer (B1) is preferably a polymer derived by substituting a part or all of hydrogen atoms of phenolic hydroxyl group in poly(4-hydroxystyrene) with an acid-dissociable group, or a polymer derived by substituting with an acid-dissociable group a part or all hydrogen atoms of phenolic hydroxyl group and/or hydrogen atoms of carboxyl group in a copolymer of 4-hydroxystyrene and/or 4-hydroxy-α-methylstyrene with (meth)acrylic acid.

Also, the structure of the polymer (B1) may be appropriately selected depending on the type of the radioactive ray employed. For example, in a radiation-sensitive positive type resin composition for which KrF excimer laser is used, the polymer (B1) is preferably, for example, a polymer that is insoluble or hardly soluble in alkali having a structure unit represented by the following formula (4) (hereinafter, may be also referred to as "structure unit (4)"), and a structure unit provided by protecting a phenolic hydroxyl group in the structure unit (4) with the acid-dissociable group. It is to be noted that the polymer is also suited for the case in which other radioactive rays such as an ArF excimer laser are employed.

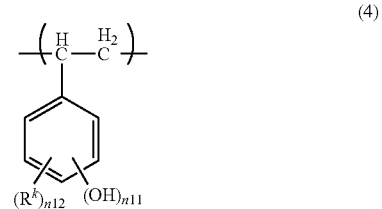

(4)

In the above formula (4), n11 and n12 are each independently an integer of 1 to 3; $R^k$ represents a hydrogen atom or a monovalent organic group, wherein, provided that $R^k$ is present in a plurality of number, the $R^k$ present in a plurality of number may be the same or different.

For example, in the radiation-sensitive positive type resin composition in which an ArF excimer laser is used, the polymer (B1) is preferably a polymer that is insoluble or hardly soluble in alkali, and that has, for example, the structure unit represented by the above formula (5) (hereinafter, may be also referred to as "structure unit (5)") or a structure unit represented by the above formula (6) (hereinafter, may be also referred to as "structure unit (6)"), and a structure unit represented by the formula (7) (hereinafter, may be also referred to as "structure unit (7)"). It is to be noted that this polymer is also suitable for the case in which other radioactive rays such as a KrF excimer laser are employed.

In the above formula (5), formula (6) and formula (7), $R^9$, $R^{13}$ and $R^{15}$ each independently represent a hydrogen atom or a methyl group. In the formula (5), $R^{10}$, $R^{11}$ and $R^{12}$ each independently represent a hydrogen atom, a hydroxyl group, a cyano group or —$COOR^{19}$; $R^{19}$ represents a hydrogen atom, a linear or branched alkyl group having 1 to 4 carbon atoms, or a cycloalkyl group having 3 to 20 carbon atoms. In the formula (6), $R^{14}$ represents a single bond or a bivalent linking group; $R^{Lc}$ represents a monovalent organic group having a lactone structure. In the formula (7), $R^{16}$, $R^{17}$ and $R^{18}$ each independently represent a monovalent alicyclic hydrocarbon group having 4 to 20 carbon atoms or a derivative thereof, or a linear or branched alkyl group having 1 to 4 carbon atoms, wherein, at least one group of $R^{16}$, $R^{17}$ and $R^{18}$ represent an alicyclic hydrocarbon group having 4 to 20 carbon atoms or a derivative thereof, or any two groups thereof form a bivalent 2° alicyclic hydrocarbon group having 4 to 20 carbon atoms or a derivative thereof together with the carbon atom to which they are each attached.

For the bivalent linking group represented by the $R^{14}$ described above, explanation of, for example, the $R^2$ described above may be adopted.

Preferable examples of the structure unit (5) include those derived from (meth)acrylic acid 3-hydroxyadamantan-1-yl, (meth)acrylic acid 3,5-dihydroxyadamantan-1-yl, (meth) acrylic acid 3-cyanoadamantan-1-yl, (meth)acrylic acid 3-carboxyadamantan-1-yl, (meth)acrylic acid 3,5-dicarboxyadamantan-1-yl, (meth)acrylic acid 3-carboxy-5-hydroxyadamantan-1-yl, (meth)acrylic acid 3-methoxycarbonyl-5-hydroxyadamantan-1-yl.

The monovalent organic group having a lactone structure represented by $R^{Lc}$ in the structure unit (6) is exemplified by groups represented by the following formulae:

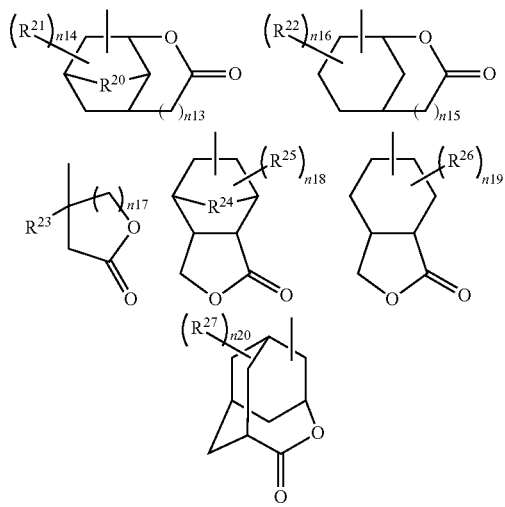

In the above formulae, $R^{20}$ and $R^{24}$ each independently represent an oxygen atom or a methylene group; $R^{21}$, $R^{22}$, $R^{23}$, $R^{25}$, $R^{26}$ and $R^{27}$ each independently represent a hydrogen atom, a linear or branched alkyl group having 1 to 4 carbon atoms, a linear or branched fluorinated alkyl group having 1 to 4 carbon atoms, or a linear or branched alkoxyl group having 1 to 4 carbon atoms; n13 and n15 are each independently 0 or 1; n14 is an integer of 0 to 3; n16 is an integer of 0 to 6; n17 is an integer of 1 to 3; n18 is an integer of 0 to 2; n19 is an integer of 0 to 4; and n20 is an integer of 0 to 9, wherein, provided that $R^{21}$, $R^{22}$, $R^{25}$, $R^{26}$, and $R^{27}$ are each present in a plurality of number, the $R^{21}$, $R^{22}$, $R^{25}$, $R^{26}$, and $R^{27}$ present in a plurality of number may be each the same or different.

The structure unit (7) is preferably a structure unit derived from 1-methylcyclopentyl(meth)acrylate, 1-ethylcyclopentyl(meth)acrylate, 1-methylcyclohexyl(meth)acrylate, 1-ethylcyclohexyl(meth)acrylate, 2-methyladamantan-2-yl(meth) acrylate, 2-ethyladamantan-2-yl(meth)acrylate, 2-n-propyladamantan-2-yl(meth)acrylate or 2-1-propyladamantan-2-yl(meth)acrylate.

The polymer (B1) may also include a structure unit other than the aforementioned structure units (4) to (7). Examples of monomer that provides the other structure unit include:

(meth)acrylic acid esters such as 7-oxo-6-oxabicyclo [3.2.1]octan-4-yl(meth)acrylate, 2-oxotetrahydropyran-4-yl (meth)acrylate, 4-methyl-2-oxotetrahydropyran-4-yl(meth) acrylate, 5-oxotetrahydrofuran-3-yl(meth)acrylate, 2-oxotetrahydrofuran-3-yl(meth)acrylate, (5-oxotetrahydrofuran-2-yl)methyl(meth)acrylate, (3,3-dimethyl-5-oxotetrahydrofuran-2-yl)methyl(meth)acrylate and 2-hydroxyethyl (meth)acrylate;

unsaturated amide compounds such as (meth)acrylamide, N,N-dimethyl(meth)acrylamide, crotonamide, maleinamide, fumaramide, mesaconamide, citraconamide and itaconamide;

unsaturated polycarboxylic acid anhydrides such as maleic anhydride and itaconic anhydride;

bicyclo[2.2.1]hept-2-ene or a derivative thereof;

monofunctional monomers such as tetracyclo[6.2.1$^{3,6}$.0$^{2,7}$]dodeca-3-ene or derivatives thereof;

polyfunctional monomers such as methylene glycol di(meth)acrylate, ethylene glycol di(meth)acrylate, 2,5-dimethyl-2,5-hexanediol di(meth)acrylate, 1,2-adamantane diol di(meth)acrylate, 1,3-adamantane diol di(meth)acrylate, 1,4-adamantane diol di(meth)acrylate and tricyclodecanedimethylol di(meth)acrylate.

For example, in the case of radiation-sensitive positive type resin compositions for which an F2 excimer laser is used, for example, polymers described in paragraph nos [0136] to of WO2009/051088 are preferable as the polymer (B1).

In the case in which the polymer (B1) is produced by polymerization of a polymerizable unsaturated monomer or through various types of polymerization, a branched structure can be introduced into the polymer (B1) by a unit derived from a polyfunctional monomer having two or more polymerizable unsaturated bonds, and/or an acetal type crosslinking group. The introduction of such a branched structure enables the heat resistance of the polymer (B1) to be enhanced. The percentage introduction of the branched structure in the polymer (B1) may be appropriately selected depending on the type of the branched structure and the polymer (B1) into which the structure is introduced, but is preferably no greater than 10 mol % with respect to all the structure units.

The molecular weight of the polymer (B1) is not particularly limited, but the polystyrene equivalent weight molecular weight (Mw) as determined by gel permeation chromatography (GPC) is typically 1,000 to 500,000, preferably 2,000 to 400,000, and more preferably 3,000 to 300,000.

The Mw of the polymer (B1) having no branched structure is preferably 1,000 to 150,000, and more preferably 3,000 to 100,000. The Mw of the polymer (B1) having the branched structure is preferably 5,000 to 500,000, and more preferably 8,000 to 300,000. Use of the polymer (B1) having the Mw falling within such a range makes the resultant resist excellent in alkali developability.

The ratio (Mw/Mn) of the Mw of the polymer (B1) to the polystyrene equivalent number average molecular weight (Mn) as determined by GPC is also not particularly limited, and is typically 1 to 10, preferably 1 to 8, and more preferably 1 to 5. Use of the polymer (B1) having the Mw/Mn falling within such a range makes the resultant resist excellent in resolving ability. In the radiation-sensitive resin composition, the polymer (B1) may be used either alone, or as a mixture of two or more thereof.

Although the method for producing the polymer (B1) is not particularly limited, the polymer (B1) may be produced by: a method which includes introducing one or more acid-dissociable group into an acidic functional group in an alkali-soluble polymer produced beforehand; a method which includes polymerizing one or more polymerizable unsaturated monomer having an acid-dissociable group with one or more other polymerizable unsaturated monomer as the case may be; a method which includes the polycondensation of one or more polycondensible components having an acid-dissociable group with other polycondensible component as the case may be; or the like.

For the polymerization of the polymerizable unsaturated monomer in producing the alkali-soluble polymer, and for the polymerization of the polymerizable unsaturated monomer having an acid-dissociable group, a polymerization initiator such as a radical polymerization initiator, a polymerization catalyst such as an anion polymerization catalyst, a coordinated anion polymerization catalyst or a cation polymerization catalyst may be appropriately selected depending on the type of the polymerizable unsaturated monomer used and the reaction medium, etc., and the polymerization may be conducted in a polymerization system for block polymerization, solution polymerization, precipitation polymerization, emulsion polymerization, suspension polymerization, block-suspension polymerization or the like. In addition, the polycondensation of the polycondensible component having an acid-dissociable group can be carried out preferably in the presence of an acidic catalyst, or in an aqueous medium or a mixed medium of water and a hydrophilic solvent.

(B2) Polymer

The polymer (B2) includes one or more structure units selected from the group consisting of a structure unit represented by the following formula (8) (hereinafter, may be also referred to as "structure unit (8)"), a structure unit represented by the formula (9) (hereinafter, may be also referred to as "structure unit (9)") and a structure unit represented by the formula (10) (hereinafter, may be also referred to as "structure unit (10)"), for example. It is to be noted that the polymer (B2) may include a structure unit other than the structure units (8) to (10) described above as long as the polymer (B2) is soluble in an alkaline developer. Such other structure unit may include, for example, a structure unit similar to the other structure unit in the polymer (B1) described above.

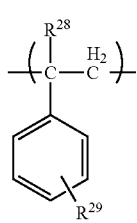

(8)

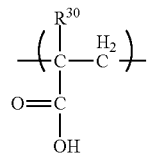

(9)

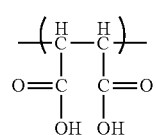

(10)

In the above formula (8) and formula (9), $R^{28}$ and $R^{30}$ each independently represent a hydrogen atom or a methyl group. In the above formula (8), $R^{29}$ represents a hydroxyl group, a carboxyl group, $-R^{31}COOH$, $-OR^{31}COOH$, $-OCOR^{31}COOH$ or $COOR^{31}COOH$ (wherein, $R^{31}$ each independently represents $-(CH_2)_{n21}-$ (wherein, n21 is an integer of 1 to 4)).

The total content of the structure units (8) to (10) in the polymer (B2) is preferably 10 mol % to 100 mol %, and more preferably 20 mol % to 100 mol % although it may vary depending on the type of the other structure unit optionally included.

The polymer (B2) is preferably a polymer including poly (4-hydroxystyrene), a 4-hydroxystyrene/4-hydroxy-α-methylstyrene copolymer or a 4-hydroxystyrene/styrene copolymer as a principal component.

Although the Mw of the polymer (B2) is not particularly limited, it is typically 1,000 to 150,000, and preferably 3,000 to 100,000. In the radiation-sensitive resin composition, the polymer (B2) may be used either alone, or as a mixture of two or more thereof.

In the case in which the radiation-sensitive resin composition contains the polymer (B2) as a principal component, i.e., when the radiation-sensitive resin composition is a radiation-sensitive negative type polymer composition, a compound (crosslinking agent) capable of crosslinking the alkali-soluble polymer in the presence of an acid may be blended. The crosslinking agent is exemplified by a compound having one or more functional groups (crosslinkable functional group) having crosslinking reactivity with the alkali-soluble polymer.

Examples of the crosslinking agent include bisphenol A type epoxy compounds, bisphenol F type epoxy compounds, bisphenol S type epoxy compounds, novolak polymer type epoxy compounds, resol polymer type epoxy compounds, poly(hydroxystyrene) type epoxy compounds, methylol group-containing melamine compounds, methylol group-containing benzoguanamine compounds, methylol group-containing urea compounds, methylol group-containing phenol compounds, alkoxyalkyl group-containing melamine compounds, alkoxyalkyl group-containing benzoguanamine compounds, alkoxyalkyl group-containing urea compound, alkoxyalkyl group-containing phenol compounds, carboxymethyl group-containing melamine polymers, carboxymethyl group-containing benzoguanamine polymers, carboxymethyl group-containing urea polymers, carboxymethyl group-containing phenol polymers, carboxymethyl group-containing melamine compounds, carboxymethyl group-containing benzoguanamine compounds, carboxymethyl group-containing urea compounds, carboxymethyl group-containing phenol compounds, and the like. The crosslinking agent may be used either alone, or as a mixture of two or more thereof.

Among these crosslinking agents, methylol group-containing phenol compounds, methoxymethyl group-containing melamine compounds, methoxymethyl group-containing phenol compounds, methoxymethyl group-containing glycoluril compounds, methoxymethyl group-containing urea compounds and acetoxy methyl group-containing phenol compounds are preferred, and methoxymethyl group-containing melamine compounds (for example, hexamethoxymethylmelamine, etc.), methoxymethyl group-containing glycoluril compounds, methoxymethyl group-containing urea compounds are more preferred. The methoxymethyl group-containing melamine compound is commercially available under the trade names of CYMEL 300, CYMEL 301, CYMEL 303 and CYMEL 305 (all manufactured by Mitsui-Cyanamid, Ltd.), and the like; the methoxymethyl group-containing glycoluril compound is commercially available under the trade name of CYMEL1174 (Mitsui-Cyanamid, Ltd.), and the like; and the methoxymethyl group-containing urea compound is commercially available under the trade name of MX290 (manufactured by SANWA Chemical Co., Ltd), and the like.

In addition, as the crosslinking agent, a polymer produced by substituting with a crosslinkable functional group hydrogen atoms of the oxygen-containing functional group in the alkali-soluble polymer to impart a property as a crosslinking agent may be suitably used. It is impossible to categorically define the percentage introduction of the crosslinkable functional group in this case depending on the type of the crosslinkable functional group and the alkali-soluble polymer into which the group is introduced, but the percentage introduction is typically 5 mol % to 60 mol %, preferably 10 mol % to 50 mol %, and more preferably 15 mol % to 40 mol % with respect to all the oxygen-containing functional groups in the polymer (B2). In this instance, the percentage introduction of the crosslinkable functional group being less than 5 mol % is likely to result in a decrease in the percentage of residual film, meandering and swelling of the pattern, and the like. To the contrary, when the percentage introduction is beyond 60 mol %, the alkali developability tends to be deteriorated.

The amount of the crosslinking agent used is preferably 5 parts by mass to 95 parts by mass, more preferably 15 parts by mass to 85 parts by mass, and particularly preferably 20 parts by mass to 75 parts by mass with respect to 100 parts by mass of the polymer (B2). When the amount of the crosslinking agent used is less than 5 parts by mass, a decrease in the percentage of residual film, meandering and swelling of the pattern, and the like are likely to be caused, whereas, when the amount is beyond 95 parts by mass, the alkali developability tends to be deteriorated.

(C) Polymer

The radiation-sensitive resin composition may appropriately contain the polymer (C). Upon formation of a resist film in the case in which the radiation-sensitive resin composition further contains the polymer (C) that includes fluorine atoms, the oil repellency of the polymer (C) can result in uneven distribution of the polymer (C) on the surface of the resist film. Therefore, the composition can be suitably used in liquid immersion lithography process.

Structure Unit (C1)

The polymer (C) is not particularly limited as long as it includes fluorine atoms in the molecule and has a content of fluorine atoms being greater than that of the polymer (B). Such a structure unit (hereinafter, may be also referred to as "structure unit (C1)") is exemplified by structure units represented by the following formulae (11) to (13) (hereinafter, these may be also referred to as "structure unit (11)", "structure unit (12)" and "structure unit (13)", respectively). When the polymer (C) includes the structure unit (C1), elution of the compound (A), an acid diffusion control agent and the like in the resist film into a liquid for liquid immersion lithography can be suppressed, and due to an increase of a receding contact angle between a resist film and a liquid for liquid immersion lithography, water droplets derived from the liquid for liquid immersion lithography are less likely to remain on the resist film so that generation of defects resulting from the liquid for liquid immersion lithography can be also suppressed.

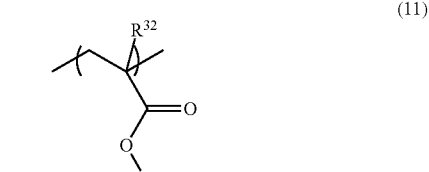

(11)

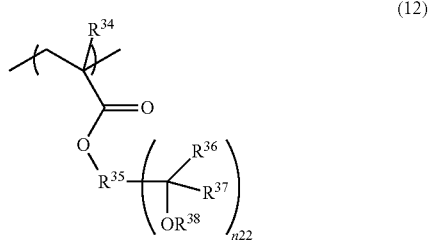

(12)

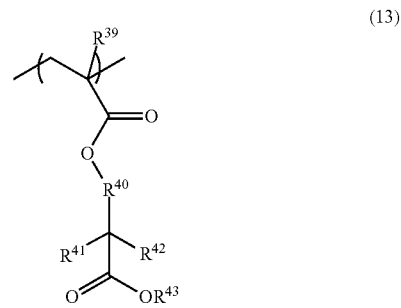

(13)

In the above formulae (11) to (13), $R^{32}$, $R^{34}$ and $R^{39}$ each independently represent a hydrogen atom, a methyl group or a trifluoromethyl group. In the above formula (11), $R^{33}$ represents a fluorinated alkyl group having 1 to 30 carbon atoms. In the above formula (12), $R^{35}$ represents a linking group having a valency of (n22+1); and n22 is an integer of 1 to 3. In the above formula (13), $R^{40}$ represents a bivalent linking group. In the above formula (12) and formula (13), $R^{38}$ and $R^{43}$ each independently represent a hydrogen atom, a monovalent hydrocarbon group having 1 to 30 carbon atoms, an acid-dissociable group, or an alkali-dissociable group; $R^{36}$, $R^{37}$, $R^{41}$ and $R^{42}$ each independently represent a hydrogen atom, a 2° fluorine atom or a fluorinated alkyl group having 1 to 30 carbon atoms, wherein, any case in which $R^{36}$, $R^{37}$, $R^{41}$ and $R^{42}$ all represent a hydrogen atom is excluded, and wherein, provided that $R^{36}$, $R^{37}$ and $R^{38}$ are each present in a plurality of number, and the $R^{36}$, $R^{37}$ and $R^{38}$ present in a plurality of number may be each the same or different.

$R^{33}$ in the above formula (11) is exemplified by a linear or branched alkyl groups having 1 to 6 carbon atoms and having substitution with at least one or more fluorine atoms, or a monovalent alicyclic hydrocarbon group having 4 to 20 carbon atoms and having substitution with at least one or more fluorine atoms, or a group derived therefrom. Specific examples of the group may include illustrative examples of the Rf described above.

Suitable examples of the monomer that provide the above structure unit (11) include trifluoromethyl(meth)acrylic acid esters, 2,2,2-trifluoroethyl(meth)acrylic acid esters, perfluoroethyl(meth)acrylic acid esters, perfluoro n-propyl(meth)acrylic acid esters, perfluoro i-propyl(meth)acrylic acid esters, perfluoro n-butyl(meth)acrylic acid esters, perfluoro i-butyl(meth)acrylic acid esters, perfluoro t-butyl(meth)acrylic acid esters, 2-(1,1,1,3,3,3-hexafluoropropyl)(meth)acrylic acid esters, 1-(2,2,3,3,4,4,5,5-octafluoropentyl)(meth)acrylic acid esters, perfluorocyclohexylmethyl(meth)acrylic acid esters, 1-(2,2,3,3,3-pentafluoropropyl)(meth)acrylic acid esters, 1-(3,3,4,4,5,5,6,6,7,7,8,8,9,9,10,10,10-heptadecafluorodecyl)(meth)acrylic acid esters, and 1-(5-trifluoromethyl-3,3,4,4,5,6,6,6-octafluorohexyl)(meth)acrylic acid esters.

The monovalent hydrocarbon group having 1 to 30 carbon atoms represented by the $R^{38}$ and $R^{43}$ described above is exemplified by a linear or branched monovalent hydrocarbon group having 1 to 10 carbon atoms, a monovalent cyclic hydrocarbon group having 3 to 30 carbon atoms, and the like. Examples of these hydrocarbon groups may include those in connection with the $R^1$ described above. However, those corresponding to the alkali-dissociable groups and the acid-dissociable group described later are excluded. In addition, the hydrocarbon group may have a substituent. Examples of such a substituent may include the substituents which may be included in the $R^1$ described above.

The acid-dissociable group represented by the $R^{38}$ and $R^{43}$ described above refers to a group that substitutes for, for example, a hydrogen atom in a polar functional group such as a hydroxyl group or a carboxyl group, and that dissociates in the presence of an acid. Specific examples of the acid-dissociable group include a t-butoxycarbonyl group, a tetrahydropyranyl group, a tetrahydrofuranyl group, a (thiotetrahydropyranylsulfanil)methyl group, a (thiotetrahydrofuranylsulfanil)methyl group, as well as an alkoxy-substituted methyl group, an alkylsulfanil-substituted methyl group, and the like. It is to be noted that the alkoxyl group (substituent) in the alkoxy-substituted methyl group is exemplified by an alkoxyl group having 1 to 4 carbon atoms. Also, the alkyl group (substituent) in the alkylsulfanil-substituted methyl group is exemplified by an alkyl group having 1 to 4 carbon atoms. Further, the acid-dissociable group is exemplified by a group represented by the formula of: [—C($R^{44}$)$_3$], wherein $R^{44}$ is as defined in connection with $R^{16}$, $R^{17}$ and $R^{18}$ in the above formula (7).

Among these acid-dissociable groups, a group represented by the formula of: [—C($R^{11}$)$_3$], a t-butoxycarbonyl group, and an alkoxy-substituted methyl group are preferred. In the structure unit (12), a t-butoxycarbonyl group, and an alkoxy-substituted methyl group are preferred. In the structure unit (13), an alkoxy-substituted methyl group, and a group represented by the formula of [—C($R^{44}$)$_3$] are preferred.

Use of the polymer (C) that includes the structure unit (12) having an acid-dissociable group and/or the structure unit (13) having an acid-dissociable group in combination with the aforementioned polymer (B1) is preferable for a radiation-sensitive positive type resin composition in light of ability to increase the solubility of the polymer (C) in an area subjected to patterning light exposure.

The alkali-dissociable group represented by the $R^{38}$ and $R^{43}$ described above is exemplified by a group that substitutes for a hydrogen atom in a polar functional group such as a hydroxyl group or a carboxyl group, and that dissociates in the presence of an alkali. Such an alkali-dissociable group is not particularly limited as long as the aforementioned properties are exhibited, and is preferably a group represented by the following formula in the above formula (12):

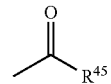

In the above formula, $R^{45}$ represents a hydrocarbon group having 1 to 10 carbon atoms and having at least one fluorine atom;

$R^{45}$ is preferably a linear or branched perfluoroalkyl group having 1 to 10 carbon atoms in which all hydrogen atoms of the aforementioned hydrocarbon group are substituted with a fluorine atom, and more preferably a trifluoromethyl group.

The alkali-dissociable group in the above formula (13) is exemplified by a group represented by the following formulae (14) to (16).

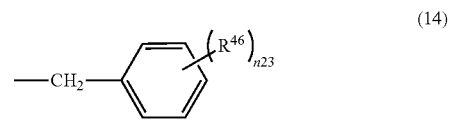

(14)

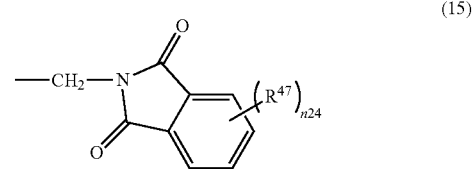

(15)

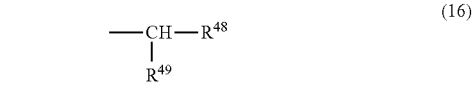

(16)

In the above formula (14) and formula (15), $R^{46}$ and $R^{47}$ each independently represent a halogen atom, an alkyl group having 1 to 10 carbon atoms, an alkoxyl group, an acyl group, or an acyloxy group; n23 is an integer of 0 to 5; and n24 is an integer of 0 to 4, wherein, provided that $R^{46}$ and $R^{47}$ are each present in a plurality of number, the $R^{46}$ and $R^{47}$ present in a plurality of number may be each the same or different. In the above formula (16), $R^{48}$ and $R^{49}$ each independently represent a hydrogen atom or an alkyl group having 1 to 10 carbon atoms, wherein, $R^{48}$ and $R^{49}$ may bind with each other together with the carbon atom to which they are attached to form an alicyclic structure having 4 to 20 carbon atoms.

Examples of the halogen atom represented by the $R^{46}$ and $R^{47}$ described above include a fluorine atom, a chlorine atom, a bromine atom, an iodine atom, and the like. Of these, a fluorine atom is preferred. The alkyl group having 1 to 10 carbon atoms represented by the $R^{46}$ and $R^{47}$ described above may be as defined in connection with the above $R^1$. In addition, the alkoxy group, the acyl group and the acyloxy group may be as defined in connection with the substituent which may be included in the above $R^1$. Examples of the alicyclic structure having 4 to 20 carbon atoms which may be formed by binding of $R^{48}$ and $R^{49}$ with each other together with the carbon atom to which they are attached include a cyclopentyl group, a cyclopentylmethyl group, a 1-(1-cyclopentylethyl) group, a 1-(2-cyclopentylethyl) group, a cyclohexyl group, a cyclohexylmethyl group, a 1-(1-cyclohexylethyl) group, a 1-(2-cyclohexylethyl group), a cycloheptyl group, a cycloheptyl methyl group, a 1-(1-cycloheptyl ethyl) group, a 1-(2-cycloheptyl ethyl) group, a 2-norbornyl group, and the like.

Examples of the group represented by the formula (16) include a methyl group, an ethyl group, a 1-propyl group, a 2-propyl group, a 1-butyl group, a 2-butyl group, a 1-pentyl group, a 2-pentyl group, a 3-pentyl group, a 1-(2-methylbutyl) group, a 1-(3-methylbutyl) group, a 2-(3-methylbutyl) group, a neopentyl group, a 1-hexyl group, a 2-hexyl group, a 3-hexyl group, a 1-(2-methylpentyl) group, a 1-(3-methylpentyl) group, a 1-(4-methylpentyl) group, a 2-(3-methylpentyl) group, a 2-(4-methylpentyl) group, a 3-(2-methylpentyl) group, and the like. Of these, a methyl group, an ethyl group, a 1-propyl group, a 2-propyl group, a 1-butyl group and a 2-butyl group are preferred.

Including in the polymer (C) the structure unit (12) having an alkali-dissociable group and/or the structure unit (13) having an alkali-dissociable group is preferred since affinity of the polymer (C) to a developer can be improved.

In addition, in the case in which $R^{38}$ and $R^{43}$ each represent a hydrogen atom in the above formulae (12) and (13), the structure unit (12) and the structure unit (13) have a hydroxyl group or a carboxyl group that is a polar group, thereby enabling the affinity of the polymer (C) to a developer to be improved.

The linking group having a valency of (n22+1) represented by $R^{35}$ in the above formula (12) is exemplified by a single bond, a hydrocarbon group having a valency of (n22+1) and 1 to 30 carbon atoms, a group in which this hydrocarbon group is combined with a sulfur atom, an imino group, a carbonyl group, —CO—O— or —CO—NH—, and the like. Examples of the hydrocarbon group having a valency of (n22+1) and 1 to 30 carbon atoms include e.g., groups derived by removing (n22+1) hydrogen atoms from a chain hydrocarbon having 1 to 10 carbon atoms such as methane, ethane, propane, butane, 2-methylpropane, pentane, 2-methylbutane, 2,2-dimethylpropane, hexane, heptane, octane, nonane or decane; groups derived by removing (n22+1) hydrogen atoms from an alicyclic hydrocarbon having 4 to 20 carbon atoms such as cyclobutane, cyclopentane, cyclohexane, bicyclo[2.2.1]heptane, bicyclo[2.2.2]octane, tricyclo[5.2.1.0$^{2,6}$]decane or tricyclo[3.3.1.1$^{3,7}$]decane; groups derived by removing (n22+1) hydrogen atoms from an aromatic hydrocarbon having 6 to 30 carbon atoms such as benzene or naphthalene, and the like.

Examples of the hydrocarbon group having a valency of (n22+1) and 1 to 30 carbon atoms, and the group in which this hydrocarbon group is combined with a sulfur atom, an imino group, a carbonyl group, —CO—O— or —CO—NH— include groups represented by the following formulae:

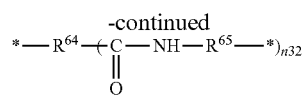

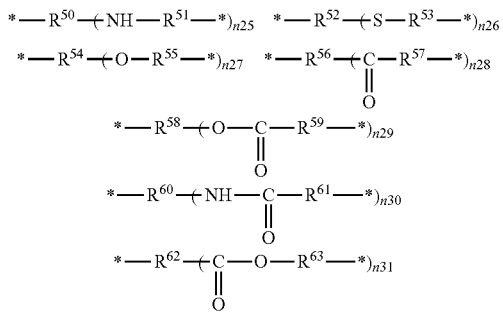

-continued $$*-R^{64}-(C-NH-R^{65}-*)_{n32}$$
with C=O

In the above formula, $R^{50}$ to $R^{65}$ each independently represent a single bond, a bivalent chain hydrocarbon group having 1 to 10 carbon atoms, a bivalent cyclic hydrocarbon group having 4 to 20 carbon atoms, or a bivalent aromatic hydrocarbon group having 6 to 30 carbon atoms; n25 to n32 are an integer of 1 to 3, wherein, provided that $R^{51}$, $R^{53}$, $R^{55}$, $R^{57}$, $R^{59}$, $R^{61}$, $R^{63}$ and $R^{65}$ are each present in a plurality of number, the $R^{51}$, $R^{53}$, $R^{55}$, $R^{57}$, $R^{59}$, $R^{61}$, $R^{63}$ and $R^{65}$ present in a plurality of number may be each the same or different; and the groups represented by $R^{50}$ to $R^{65}$ may be as defined in connection with the $R^{35}$ described above.

$R^{35}$ may have a substituent. The substituent may be as defined in connection with the substituent which may be included in the $R^1$ described above. The bivalent linking group represented by $R^{40}$ in the above formula (13) may be as defined in connection with the $R^{35}$ in the case in which n22 is 1. In the formula (12) or (13), the fluorinated hydrocarbon group having 1 to 30 carbon atoms represented by $Rf^2$ may be as defined in connection with the $R^{33}$ described above.

With respect to a combination of $R^{36}$ and $R^{37}$ in the above formula (12), a partial structure is preferably provided in which $R^{36}$ and $R^{37}$ both represent a trifluoromethyl group. With respect to a combination of $R^{41}$ and $R^{42}$ in the above formula (13), a partial structure is preferably provided in which $R^{41}$ and $R^{42}$ both represent a fluorine atom.

Examples of the monomer that provides the structure unit (12) capable of providing the preferable partial structure described above include compounds represented by the following formulae, and the like.

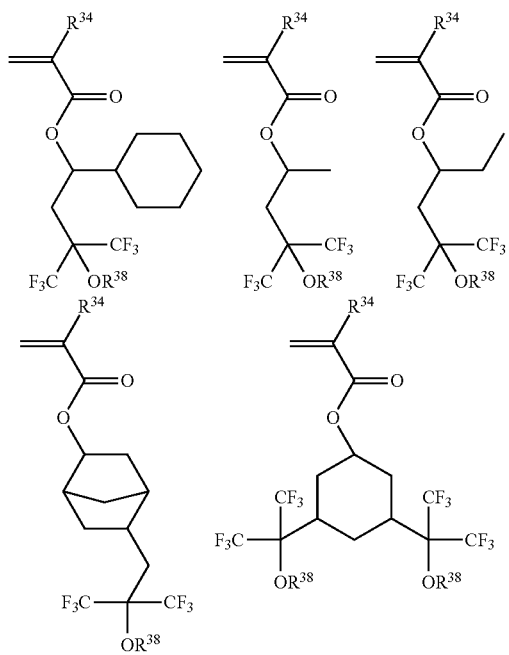

In the above formula, $R^{34}$ and $R^{38}$ are as defined in connection with the above formula (12).

The compound represented by the above formula, wherein $R^{38}$ represents an acid-dissociable group or an alkali-dissociable group can be synthesized according to a conventionally well-known method using as a raw material, for example, a compound represented by each of the above formula wherein $R^{38}$ represents a hydrogen atom.

Examples of monomers that provide the structure unit (13) having the aforementioned preferable partial structure include e.g., compounds represented by the following formulae, and the like.

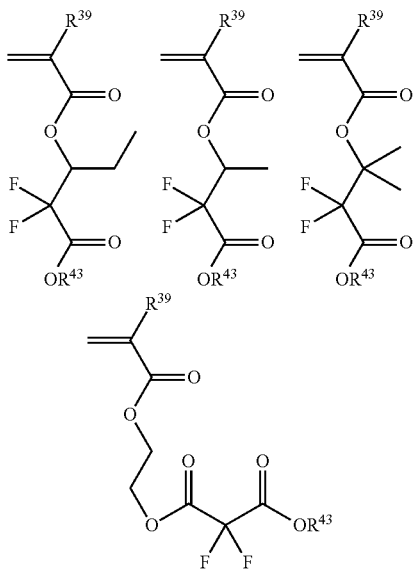

In the above formula, $R^{39}$ and $R^{43}$ are as defined in connection with the above formula (13).

The compound represented by the above formula, wherein $R^{43}$ represents an acid-dissociable group or an alkali-dissociable group can be synthesized according to a conventionally well-known method using as a raw material, for example, a compound represented by each of the above formula wherein $R^{43}$ represents a hydrogen atom, or a derivative thereof. Specifically, for example a reaction between a compound represented by the following formula (17), and a compound represented by the formula (18) may be allowed to obtain the intended compound.

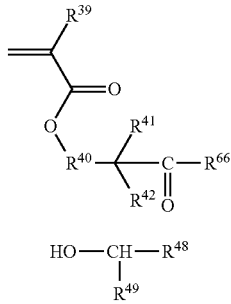

In the above formula (17), $R^{39}$ to $R^{42}$ are as defined in connection with the formula (13); and $R^{66}$ represents a hydroxyl group or halogen atom. In the above formula (18), $R^{48}$ and $R^{49}$ are as defined in connection with the formula (16).

The polymer (C) may include only one type of the structure units (11) to (13), and preferably includes two or more types of structure units (11) to (13), and more preferably includes the structure unit (12) and the structure unit (13).

The polymer (C) may further include in addition to the structure unit (C1), each two or more types of: a structure unit having an acid-dissociable group other than the structure unit (C1) (hereinafter, may be also referred to as "structure unit (C2)"), a structure unit having an alkali-soluble group (excluding those falling under the structure unit (C1)) (hereinafter, may be also referred to as "structure unit (C3)"), or a structure unit having a lactone skeleton (hereinafter, may be also referred to as "structure unit (4)").

Structure Unit (C2)

In the case in which the polymer (C) has the structure unit (C2), use in combination with the polymer (B1) is particularly preferred for obtaining a positive type radiation-sensitive resin composition. In this case, the difference between an advancing contact angle and a receding contact angle in a photoresist film can be minimized, thereby capable of leading to a response to an increase in scanning speed during exposure. The structure unit (C2) is preferably, for example, the structure unit represented by the above formula (7).

The structure unit (C2) is more preferably a structure unit represented by the following formula:

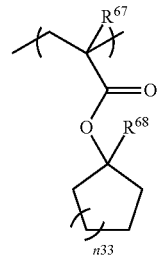

In the above formula, $R^{67}$ represents a hydrogen atom, a methyl group, a trifluoromethyl group or a hydroxymethyl group; $R^{68}$ represents a linear or branched alkyl group having 1 to 4 carbon atoms; and n33 is an integer of 1 to 4.

Examples of the linear or branched alkyl group having 1 to 4 carbon atoms represented by the $R^{68}$ include e.g., a methyl group, an ethyl group, a n-propyl group, an i-propyl group, a n-butyl group, a 2-methylpropyl group, a 1-methylpropyl group, a t-butyl group, and the like.

The polymer (C) may further have other structure unit such as a structure unit (C3) other than the structure units (C1) and (C2), as well as the structure unit represented by the above formula (6), and the like. When the polymer (C) further has other structure unit, solubility in a developer can be increased.

Structure Unit (C3)

The alkali-soluble group in the structure unit (C3) is preferably a functional group having a hydrogen atom and having a pKa of 4 to 11, in light of increase of the solubility in a developer. Examples of the functional group include functional groups represented by the following formula, and the like.

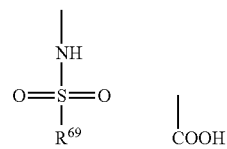

In the above formula, $R^{69}$ represents a fluorinated hydrocarbon group having 1 to 10 carbon atoms. The fluorinated hydrocarbon group having 1 to 10 carbon atoms is preferably a trifluoromethyl group. It is to be noted that a main chain skeleton of the structure unit (C3) is not particularly limited, and is preferably a methacrylic acid ester, an acrylic acid ester, and an α-trifluoroacrylic acid ester acrylate.

Examples of the compound that provides the structure unit (C3) include compounds represented by the following formulae.

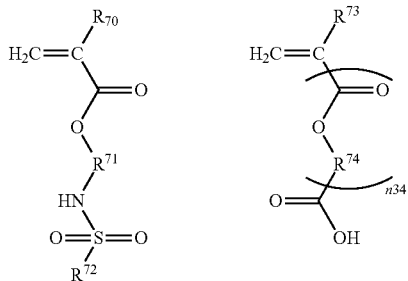

In the above formula, $R^{70}$ and $R^{79}$ represent a hydrogen atom, a methyl group or a trifluoromethyl group; $R^{71}$ and $R^{74}$ represent a bivalent linking group; $R^{72}$ represents a fluorinated hydrocarbon group having 1 to 10 carbon atoms; and n34 is 0 or 1.

The bivalent linking group represented by the $R^{71}$ and $R^{74}$ described above may be exemplified similarly to those of $R^{40}$ in the formula (13). The fluorinated hydrocarbon group having 1 to 10 carbon atoms represented by $R^{72}$ is preferably a trifluoromethyl group.

The percentage of the structure unit (C1) contained with respect to 100 mol % of total of all structure units in the polymer (C) is preferably 20 mol % to 90 mol %, and more preferably 20 mol % to 80 mol %. The percentage of the structure unit (C2) contained is typically no greater than 80 mol %, preferably 20 mol % to 80 mol %, and more preferably 30 mol % to 70 mol %. The percentage of the structure unit (C2) contained falling within this range is particularly advantageous in light of possibility of minimizing the difference between the advancing contact angle and the receding contact angle. Further, the percentage of the structure unit (C3) contained is typically no greater than 50 mol %, preferably 5 mol % to 30 mol %, and more preferably 5 mol % to 20 mol %. The percentage of the structure unit represented by the above formula (6) is typically no greater than 50 mol %, preferably 5 mol % to 30 mol %, and more preferably 5 mol % to 20 mol %.

Synthesis Method of Polymer (C)

The polymer (C) can be produced by polymerizing, for example, a polymerizable unsaturated monomer that corresponds to each specified structure unit using a radical polymerization initiator such as hydroperoxides, dialkyl peroxides, diacyl peroxides, or azo compound, in the presence of a chain transfer agent as needed in an appropriate solvent.

Examples of the solvent include alkanes such as n-pentane, n-hexane, n-heptane, n-octane, n-nonane and n-decane; cycloalkanes such as cyclohexane, cycloheptane, cyclooctane, decalin and norbornane; aromatic hydrocarbons such as benzene, toluene, xylene, ethylbenzene and cumene; halogenated hydrocarbons such as chlorobutanes, bromohexanes, dichloroethanes, hexamethylene dibromide and chlorobenzene; saturated carboxylate esters such as ethyl acetate, n-butyl acetate, i-butyl acetate and methyl propionate; ketones such as acetone, 2-butanone, 4-methyl-2-pentanone and 2-heptanone; ethers such as tetrahydrofuran, dimethoxyethanes and diethoxyethanes; alcohols such as methanol, ethanol, 1-propanol, 2-propanol and 4-methyl-2-pentanol, and the like. These solvents may be used either alone, or as a mixture of two or more types thereof.

The reaction temperature in the polymerization is typically 40° C. to 150° C., and preferably 50° C. to 120° C. The reaction time is typically 1 hour to 48 hrs, and preferably 1 hour to 24 hrs.

The polymer (C) has a Mw of preferably 1,000 to 50,000, more preferably 1,000 to 40,000, and particularly preferably 1,000 to 30,000. The Mw of less than 1,000 may lead to failure in obtaining a photoresist film having a sufficient receding contact angle. To the contrary, the Mw beyond 50,000 may result in a decrease of developability of a photoresist film. The Mw/Mn of the polymer (C) is preferably 1 to 5, and more preferably 1 to 4.

The content of the polymer (C) with respect to 100 parts by mass of the polymer (B) is preferably 0.1 parts by mass to 20 parts by mass, more preferably 1 part by mass to 10 parts by mass, and particularly preferably 1 part by mass to 7.5 parts by mass. When the content is less than 0.1 parts by mass, the effects achieved by containing the polymer (C) may not be sufficient. To the contrary, the content exceeding 20 parts by mass may result in development defects as a result of excessively enhanced water repellency of the surface of the resist.

The content of fluorine atoms in the polymer (C), with respect to 100% by mass of the entire fluorine-containing polymer, is typically no less than 5% by mass, preferably 5% by mass to 50% by mass, and more preferably 5% by mass to 40% by mass. It is to be noted that the content of fluorine atoms may be determined by $^{13}$C-NMR. The content of fluorine atoms in the polymer (C) falling within the above range can serve in elevating water repellency of the surface of the photoresist film formed with the photoresist composition containing the polymer (C) and the polymer (B) described above, and thus the need for separately forming an upper layer film in liquid immersion lithography can be eliminated.

Other Optional Component

The radiation-sensitive resin composition may contain in addition to the components (A) to (C), other optional components such as an acid diffusion control agent, a lactone compound, a dissolution control agent, a surfactant and/or a sensitizer within a range not to impair the effects of the present invention. Hereinafter, these optional components are explained in detail. The other optional components may be each used either alone, or two or more types thereof may be used in combination.

Acid Diffusion Control Agent

An acid diffusion control agent has an effect of suppressing an unwanted chemical reaction in an unexposed region by controlling a phenomenon of diffusion of an acid, which is generated from a radiation-sensitive acid generator upon exposure, in the resist film. By blending such an acid diffusion control agent, storage stability of the radiation-sensitive resin composition can be improved, and the resolution can be further enhanced. In addition, suppression of variation of the line width of the resist pattern is enabled that results from varying post exposure time passed during the exposure and the development treatment, and as a result, a radiation-sensitive resin composition that is extremely superior in the process stability can be obtained.

The acid diffusion control agent is exemplified by a nitrogen-containing compound (α), a nitrogen-containing compound (β), a nitrogen-containing compound (γ), an amide group-containing compound, an urea compound, a nitrogen-containing heterocyclic compound, a nitrogen-containing organic compound, and the like.

Examples of the nitrogen-containing compound (α) include monoalkylamines such as n-hexylamine, n-heptylamine, n-octylamine, n-nonylamine and n-decylamine; dialkylamines such as di-n-butylamine, di-n-pentylamine, di-n-hexylamine, di-n-heptylamine, di-n-octylamine, di-n-nonylamine and di-n-decylamine; trialkylamines such as triethylamine, tri-n-propylamine, tri-n-butylamine, tri-n-pentylamine, tri-n-hexylamine, tri-n-heptylamine, tri-n-octylamine, tri-n-nonylamine and tri-n-decylamine; alkanolamines such as ethanolamine, diethanolamine and triethanolamine; aromatic amines such as aniline, N-methylaniline, N,N-dimethyl aniline, 2-methylaniline, 3-methylaniline, 4-methylaniline, 4-nitroaniline, diphenylamine, triphenylamine and 1-naphthylamine, and the like.

Examples of the nitrogen-containing compound (β) include ethylenediamine, N,N,N',N'-tetramethylethylenediamine, tetramethylenediamine, hexamethylenediamine, N,N,N',N'-tetrakis (2-hydroxyethyl)ethylenediamine, N,N,N',N'-tetrakis (2-hydroxypropyl)ethylenediamine, 4,4'-diaminodiphenyl methane, 4,4'-diaminodiphenyl ether, 4,4'-diaminobenzophenone, 4,4'-diaminodiphenylamine, 2,2'-bis(4-aminophenyl)propane, 2-(3-aminophenyl)-2-(4-aminophenyl)propane, 2-(4-aminophenyl)-2-(3-hydroxyphenyl)propane, 2-(4-aminophenyl)-2-(4-hydroxyphenyl)propane, 1,4-bis[1-(4-aminophenyl)-1-methylethyl]benzene, 1,3-bis[1-(4-aminophenyl)-1-methylethyl]benzene, and the like.

Examples of the nitrogen-containing compound (γ) include polyethyleneimine, polyallylamine, polymers of N-(2-dimethylaminoethyl)acrylamide, and the like.

Examples of the amide group-containing compound include formamide, N-methylformamide, N,N-dimethyl formamide, acetamide, N-methylacetamide, N,N-dimethylacetamide, propionamide, benzamide, pyrrolidone, N-methylpyrrolidone, and the like.

Examples of the urea compound include urea, methylurea, 1,1-dimethylurea, 1,3-dimethylurea, 1,1,3,3-tetramethylurea, 1,3-diphenylurea, tri-n-butylthio urea, and the like.

Examples of the nitrogen-containing heterocyclic compound include imidazoles such as imidazole, benzimidazole, 2-methylimidazole, 4-methylimidazole, 1,2-dimethyl imidazole, 2-phenylimidazole, 4-phenylimidazole, 4-methyl-2-phenylimidazole and 2-phenylbenzimidazole; pyridines such as pyridine, 2-methylpyridine, 4-methylpyridine, 2-ethylpyridine, 4-ethylpyridine, 2-phenylpyridine, 4-phenylpyridine, 2-methyl-4-phenylpyridine, nicotine, nicotinic acid, nicotinic acid amide, quinoline, 8-oxyquinoline and acridine, as well as pyrazine, pyrazole, pyridazine, quinoxaline, purine, pyrrolidine, piperidine, 1-piperidine ethanol, 2-piperidine ethanol, morpholine, 4-methylmorpholine, piperazine, 1,4-dimethyl piperazine, 1,4-diazabicyclo[2.2.2]octane, and the like.

As the nitrogen-containing organic compound, for example, a compound having an acid-dissociable group may be also used. Examples of the nitrogen-containing organic compound having an acid-dissociable group include N-(t-butoxycarbonyl)piperidine, N-(t-butoxycarbonyl)imidazole, N-(t-butoxycarbonyl)benzimidazole, N-(t-butoxycarbonyl)-2-phenylbenzimidazole, N-(t-butoxycarbonyl)di-n-octylamine, N-(t-butoxycarbonyl)diethanolamine, N-(t-butoxycarbonyl)dicyclohexylamine, N-(t-butoxycarbonyl) diphenylamine, tert-butyl-4-hydroxy-1-piperidine carboxylate, and the like.

Among these nitrogen-containing organic compounds, the nitrogen-containing compounds (α), the nitrogen-containing compounds (β), the nitrogen-containing heterocyclic compounds, the nitrogen-containing organic compounds having an acid-dissociable group are preferred.

In addition, as the acid diffusion control agent, for example, a compound represented by the following formula: $X^+Z^-$, or the like may be also used.

In the above formula, $X^+$ is a cation represented by the following formula (19) or formula (20); $Z^-$ is $OH^-$, an anion represented by the formula of: $R^{75}$—$COO^-$, or an anion represented by the formula of: $R^{75}$—$SO_3^-$; $R^{75}$ represents an alkyl group, an alicyclic hydrocarbon group, or an aryl group, wherein, a part or all of hydrogen atoms of these groups may be substituted.

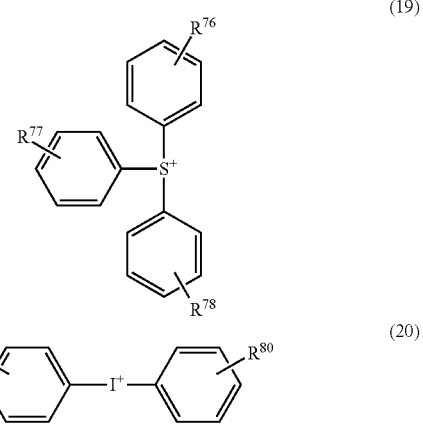

In the above formula (19), $R^{76}$ to $R^{78}$ each independently represent a hydrogen atom, an alkyl group, an alkoxyl group, a hydroxyl group or a halogen atom. In the above formula (20), $R^{79}$ and $R^{80}$ each independently represent a hydrogen atom, an alkyl group, an alkoxyl group, a hydroxyl group or a halogen atom; and $R^{76}$ to $R^{78}$ preferably represent a hydrogen atom, an alkyl group, or a halogen atom.

$R^{75}$ preferably represents an alicyclic hydrocarbon group or an aryl group. Examples of the alkyl group which may be substituted and represented by $R^{75}$ include hydroxyalkyl groups having 1 to 4 carbon atoms such as a hydroxymethyl group, a 1-hydroxyethyl group, a 2-hydroxyethyl group, a 1-hydroxypropyl group, a 2-hydroxypropyl group, a 3-hydroxypropyl group, a 1-hydroxybutyl group, a 2-hydroxybutyl group, a 3-hydroxybutyl group and a 4-hydroxybutyl group; alkoxyl groups having 1 to 4 carbon atoms such as a methoxy group, an ethoxy group, a n-propoxy group, an i-propoxy group, a n-butoxy group, a 2-methylpropoxy group, a 1-methylpropoxy group and a t-butoxy group; a cyano group; groups having one or more substituent such as cyano alkyl groups having 2 to 5 carbon atoms such as a cyanomethyl group, a 2-cyano ethyl group, a 3-cyano propyl group and a 4-cyano butyl group, and the like. Of these, a hydroxymethyl group, a cyano group and a cyanomethyl group are preferred.

Examples of the alicyclic hydrocarbon group which may be substituted and represented by $R^{75}$ include cycloalkane skeletons such as hydroxycyclopentane, hydroxycyclohexane, and cyclohexanone; monovalent groups derived from an alicyclic hydrocarbon such as bridged alicyclic skeleton such as 1,7,7-trimethyl bicyclo[2.2.1]heptane-2-one (camphor), and the like. Of these, groups derived from 1,7,7-trimethyl bicyclo[2.2.1]heptane-2-one are preferred.

Examples of the aryl group which may be substituted and represented by $R^{75}$ include groups obtained by substituting a phenyl group, a benzyl group, a phenylethyl group, a phenylpropyl group, a phenylcyclohexyl group or the like with a hydroxyl group, a cyano group or the like, and the like. Of these, a phenyl group, a benzyl group and a phenylcyclohexyl group are preferred.

$Z^-$ is preferably an anion represented by the following formula:

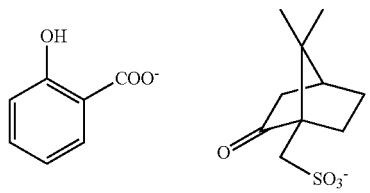

In the case in which $X^+$ is a cation represented by the above formula (19), i.e., in the case in which a photodegradable acid diffusion control agent is a sulfonium salt compound, specific examples include triphenylsulfonium hydroxide, triphenylsulfonium acetate, triphenylsulfonium salicylate, diphenyl-4-hydroxyphenylsulfonium hydroxide, diphenyl-4-hydroxyphenylsulfonium acetate, diphenyl-4-hydroxyphenylsulfonium salicylate, triphenylsulfonium 10-camphorsulfonate, 4-t-butoxyphenyldiphenylsulfonium 10-camphorsulfonate, and the like. It is to be noted that these sulfonium salt compound may be used either or as a combination of two or more thereof.

In the case in which $X^+$ is a cation represented by the above formula (20), i.e., in the case in which a photodegradable acid diffusion control agent is an iodonium salt compound, specific examples include bis(4-t-butylphenyl)iodonium hydroxide, bis(4-t-butylphenyl)iodonium acetate, bis(4-t-butylphenyl)iodonium hydroxide, bis(4-t-butylphenyl)iodonium acetate, bis(4-t-butylphenyl)iodonium salicylate, 4-t-butylphenyl-4-hydroxyphenyliodonium hydroxide, 4-t-butylphenyl-4-hydroxyphenyliodonium acetate, 4-t-butylphenyl-4-hydroxyphenyliodonium salicylate, bis(4-t-butylphenyl)iodonium 10-camphorsulfonate, diphenyliodonium 10-camphorsulfonate, and the like. It is to be noted that these iodonium salt compounds may be used either alone or as a combination of two or more thereof.

The content of the acid diffusion control agent is preferably no greater than 20 parts by mass, and more preferably 0.01 parts by mass to 15 parts by mass with respect to 100 parts by mass of the polymer (B). When the content of the acid diffusion control agent is no less than 0.01 parts by mass, suppression of deterioration of pattern configuration and dimension fidelity depending on process conditions is enabled. To the contrary, when the content is no greater than 20 parts by mass, the sensitivity and alkali developability can be further enhanced.

Lactone Compound

A lactone compound has an effect of allowing the polymer (C) to be more efficiently distributed unevenly on the surface of the resist film. Therefore, due to the radiation-sensitive resin composition further containing the lactone compound when the polymer (C) is used, the amount of the polymer (C) to be added can be reduced. As a result, elution of components from the resist film into the liquid for liquid immersion can be suppressed without deteriorating fundamental characteristics as a resist, and maintaining of water repellency of the surface of the resist film is enabled so that defects resulting from the liquid immersion such as watermark defects can be suppressed without leaving droplets even if liquid immersion lithography is carried out by fast scanning.

Examples of the lactone compound include γ-butyrolactone, valerolactone, mevalonic lactone, norbornanelactone, and the like.

The content of the lactone compound is typically 30 parts by mass to 300 parts by mass, and preferably 50 parts by mass to 250 parts by mass with respect to 100 parts by mass of the polymer (B). When the content of the lactone compound is less than 30 parts by mass, water repellency of the surface of the resist film cannot be sufficiently attained in the case in which a small amount of the polymer (C) is added. To the contrary, when the content is beyond 300 parts by mass, fundamental performance and pattern configuration after the development of the resist may be deteriorated.

[Dissolution Control Agent]

A dissolution control agent has a property that solubility in an alkaline developer is enhanced by an action of an acid. The dissolution control agent is exemplified by a compound having an acidic functional group such as a phenolic hydroxyl group, a carboxyl group or a sulfonic acid group, as well as a compound obtained by substituting a hydrogen atom of the acidic functional group in the described above compound with an acid-dissociable group, and the like.

The dissolution control agent may be either a low molecular compound or a high molecular compound, and as a high molecular dissolution control agent in a radiation-sensitive negative type resin composition, for example, the polymer (B1) may be used.

The content of the dissolution control agent is typically no greater than 50 parts by mass, and preferably no greater than 20 parts by mass with respect to 100 parts by mass of the polymer (B).

[Surfactant]

A surfactant has an effect of improving coating properties, striation, developability and the like of the radiation-sensitive resin composition.

As a surfactant, any of anionic, cationic, nonionic or amphoteric surfactant may be used, and nonionic surfactant is preferably used.

Examples of the nonionic surfactant include polyoxyethylene higher alkyl ethers, polyoxyethylene higher alkylphenyl ethers, higher aliphatic acid diesters of polyethylene glycol, as well as the following trade names, "KP" (manufactured by Shin-Etsu Chemical Co., Ltd.), "Polyflow" (manufactured by Kyoeisha Chemical Co., Ltd.), (manufactured by Mitsubishi Materials Electronic Chemicals Co., Ltd. (formerly, JEMCO Inc.)), "MEGAFACE" (manufactured by Dainippon Ink and Chemicals, Incorporated), "Fluorad" (manufactured by Sumitomo 3M Limited), "AsahiGuard" and "Surflon" (manufactured by Asahi Glass Co., Ltd.), and the like.

The content of the surfactant is typically no greater than 2 parts by mass, and preferably no greater than 1.5 parts by mass with respect to 100 parts by mass of the polymer (B).

Sensitizer

A sensitizer has an effect of absorbing energy of a radioactive ray, and transmitting the energy to a radiation-sensitive acid generator, thereby increasing the amount of the acid produced to improve apparent sensitivity of the radiation-sensitive resin composition.

Examples of the sensitizer include acetophenones, benzophenones, naphthalenes, biacetyl, eosine, rose bengal, pyrenes, anthracenes, phenothiazines, and the like.

The content of the sensitizer is typically no greater than 50 parts by mass, and preferably no greater than 30 parts by mass with respect to 100 parts by mass of the polymer (B).

Preparation Method Radiation-Sensitive Resin Composition

The radiation-sensitive resin composition is prepared by, for example, dissolving each component in a solvent in use to give a homogenous solution, and thereafter filtering through a filter having a pore size of about 0.2 μm or the like as needed.

Examples of the solvent include ethers, esters, ether esters, ketones, ketone esters, amides, amide esters, lactams, (halogenated) hydrocarbons, and the like. More specifically, examples of the solvent include ethylene glycol monoalkyl ethers, diethylene glycol dialkyl ethers, propylene glycol monoalkyl ethers, propylene glycol dialkyl ethers, ethylene glycol monoalkyl ether acetates, propylene glycol monoalkyl ether acetates, acyclic or cyclic ketones, ester acetates, hydroxy ester acetates, alkoxy ester acetates, aceto ester acetates, propionic acid esters, lactic acid esters, other substituted propionic acid esters, (substituted) butyric acid esters, pyruvic acid esters, N,N-dialkylformamides, N,N-dialkylacetamides, N-alkylpyrrolidones, (halogenated) aliphatic hydrocarbons, (halogenated) aromatic hydrocarbons, and the like. Specific examples of the solvent include solvents described in paragraph no. [0202] of WO2009/051088, and the like.

Among these solvents, propylene glycol monoalkyl ether acetates, acyclic or cyclic ketones, lactic acid esters, 3-alkoxypropionic acid esters and the like are preferred in that favorable film intra-plane uniformity can be secured in coating. The solvent may be used either alone, or as a mixture of two or more thereof.

In addition, a solvent having a high boiling point such as e.g., benzylethyl ether, di-n-hexyl ether, diethylene glycol monomethyl ether, diethylene glycol monoethyl ether, acetonyl acetone, isophorone, caproic acid, caprylic acid, 1-octanol, 1-nonanol, benzyl alcohol, benzyl acetate, ethyl benzoate, diethyl oxalate, diethyl maleate, ethylene carbonate, propylene carbonate or ethylene glycol monophenyl ether acetate may be used as needed together with the solvent described above. The other solvent may be used either alone, or as a mixture of two or more thereof. The proportion of the other solvent used is typically no greater than 50% by mass, and preferably no greater than 30% by mass with respect to the entire solvent.

Total amount of the solvent used makes the total solid content of the radiation-sensitive composition be typically 0.5% by mass to 50% by mass, preferably 1% by mass to 30% by mass, and more preferably 1% by mass to 10% by mass. When the total solid content of the solution falls within the above range, favorable film intra-plane uniformity can be secured in coating.

Method for Forming a Resist Pattern

The resist pattern can be formed by: coating the radiation-sensitive resin composition on a substrate such as a silicon wafer or a wafer covered with aluminum by an appropriate coating means for spin-coating, cast coating, roll coating or the like; carrying out a heat treatment (PB) to form a resist film, as the case may be; exposing through a predetermined mask pattern; and developing.

Examples of the radioactive ray which may be used in the exposure include far ultraviolet rays such as a bright line spectrum in a mercury lamp (wavelength: 254 nm), a KrF excimer laser (wavelength: 248 nm), an ArF excimer laser (wavelength: 193 nm), an F2 excimer laser (wavelength: 157 nm), and an EUV (wavelength: 13 nm, etc.); X-rays such as synchrotron radioactive rays; charged particle-rays such as electron beams, and the like. The radioactive ray is preferably a far ultraviolet ray and a charged particle-ray. More preferably, the radioactive ray is KrF excimer laser (wavelength: 248 nm), ArF excimer laser (wavelength: 193 nm), F2 excimer laser (wavelength: 157 nm) and electron beams. It is to be noted that a liquid for liquid immersion lithography may be placed on a resist film, and the resist film can be exposed through the liquid for liquid immersion lithography. In addition, conditions for exposure such as radiation dose may be determined ad libitum depending on the compositional formulation of the radiation-sensitive resin composition.

After the exposure, it is preferable to carry out a heat treatment (PEB). Heating conditions of the PEB may vary depending on the compositional formulation of the radiation-sensitive resin composition, the type of the additive, and the like, the temperature is typically 30° C. to 200° C., and preferably 50° C. to 150° C.

The exposed resist film is developed with an alkaline developer to form a predetermined positive type or negative type resist pattern. The alkaline developer is exemplified by an alkaline aqueous solution prepared by dissolving one or more alkaline compounds selected from, for example, alkali metal hydroxide, ammonia water, alkylamines, alkanolamines, heterocyclic amines, tetraalkylammonium hydroxides, choline, 1,8-diazabicyclo[5.4.0]-7-undecene, and 1,5-diazabicyclo[4.3.0]-5-nonene. The alkaline developer is preferably an aqueous solution of tetraalkylammonium hydroxides.

The concentration of the alkaline aqueous solution is preferably no greater than 10% by mass, more preferably 1% by mass to 10% by mass, and particularly preferably 2% by mass to 5% by mass. In this instance, when the concentration of the alkaline aqueous solution is no greater than 10% by mass, dissolution of a light-unexposed site (in the case of positive type) or a light-exposed site (in the case of negative type) in the alkaline developer can be suppressed. It is to be noted that an appropriate amount of a surfactant and the like is preferably added to the alkaline aqueous solution.

EXAMPLES

Hereinafter, the present invention is more specifically explained by way of Examples and Comparative Examples, but the present invention is not in anyhow limited to these Examples.

Monomers used in the synthesis of the polymer (B) and polymer (C) are shown below.

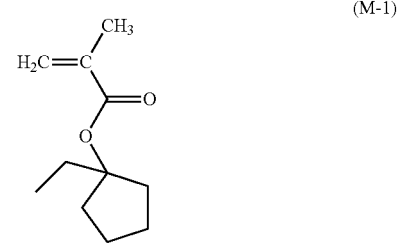
(M-1)

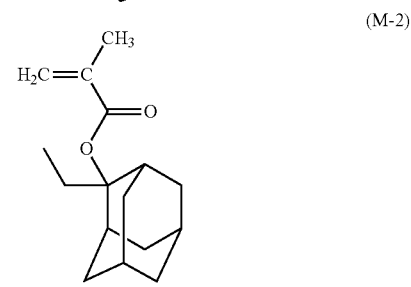
(M-2)

-continued

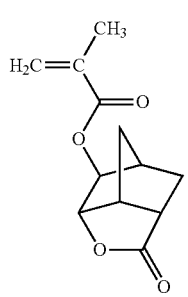
(M-3)

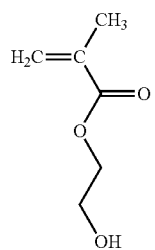
(M-4)

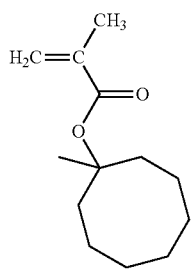
(M-5)

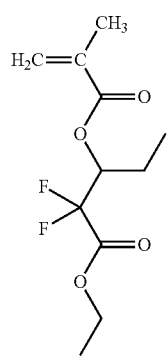
(M-6)

Synthesis of Polymer (B)

Synthesis Example 1

A monomer solution was prepared by dissolving 31.63 g (35 mol %) of the compound (M-1), 49.60 g (45 mol %) of the compound (M-3) and 6.45 g (10 mol %) of the compound (M-4) in 200 g of 2-butanone, to which 8.14 g of 2,2'-azobis (2-methylpropionitrile) was further charged. A 1,000 mL three-neck flask charged with 12.32 g (10 mol %) of the compound (M-2) and 100 g of 2-butanone was purged with nitrogen for 30 min. After the nitrogen purge, the reaction vessel was heated to 80° C. while stirring, and the monomer solution prepared beforehand was added dropwise thereto using a dripping funnel over 3 hrs. A time point at which the dropwise addition was started was defined as a polymerization starting time, and a polymerization reaction was carried out for 6 hrs. After completing the polymerization, the polymerization solution was cooled to no higher than 30° C. by water-cooling, and charged in 4,000 of methanol. The white powder thus precipitated was filtered off. The white powder obtained by filtration was dispersed in 400 g of methanol to give a slurry state, followed by washing and filtration. Such an operation was repeated twice, and thereafter vacuum dried at 50° C. for 17 hrs to obtain a copolymer (B-1) as a white powder. The copolymer (B-1) had a Mw of 4,300, Mw/Mn of 1.30, and as a result of $^{13}$C-NMR analysis, had the content the structure units derived from compounds (M-1), (M-2), (M-3) and (M-4) of 35.6:8.9:46.2:9.3 (mol %), respectively.

Synthesis of (C) Polymer

Synthesis Example 2

A monomer solution was prepared by dissolving 37.41 g (40 mol %) of the compound (M-5) and 62.59 g (60 mol %) of the compound (M-6) in 100 g of 2-butanone, to which 4.79 g of 2,2'-azobis(2-methylpropionitrile) was further charged. A 1,000 mL three-neck flask charged with 100 g of 2-butanone was purged with nitrogen for 30 min. After the nitrogen purge, the reaction vessel was heated to 80° C. while stirring, and the monomer solution prepared beforehand was added dropwise thereto using a dripping funnel over 3 hrs. A time point at which the dropwise addition was started was defined as a polymerization starting time, and a polymerization reaction was carried out for 6 hrs. After completing the polymerization, 150 g of 2-butanone was removed in vacuo from the polymerization solution. After cooling to no higher than 30° C., the solution was charged into a mixed solvent of 900 g of methanol and 100 g of ultra pure water, and the precipitated white powder was filtered off. The white powder obtained by filtration was dispersed in 100 g of methanol to give a slurry state, followed by washing and another subsequent filtration. Such an operation was repeated twice, and the obtained white powder was vacuum dried at 50° C. for 17 hrs to obtain a copolymer (C-1). The copolymer (C-1) had a Mw of 6,920, Mw/Mn of 1.592, and as a result of $^{13}$C-NMR analysis, had the content the structure units derived from compounds (M-5) and (M-6) of 40.8: 59.2 (mol %), respectively. The fluorine content was 9.6% by mass.

The compound (A), the acid diffusion control agent, the solvent and the lactone compound used in preparation of the radiation-sensitive resin compositions of Examples and Comparative Examples are shown below.

Compound (A)

A-1: Triphenylsulfonium 4-(1-adamantanecarbonyloxy)-1,1,2-trifluorobutanesulfonate represented by the following formula:

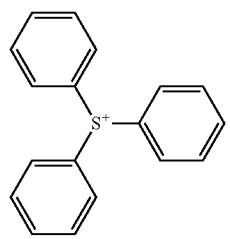

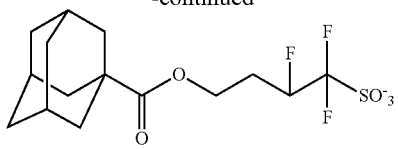
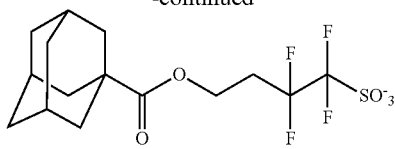

A-2: A compound represented by the following formula:

Acid Diffusion Control Agent
D-1: Triphenylsulfonium salicylate represented by the following formula:

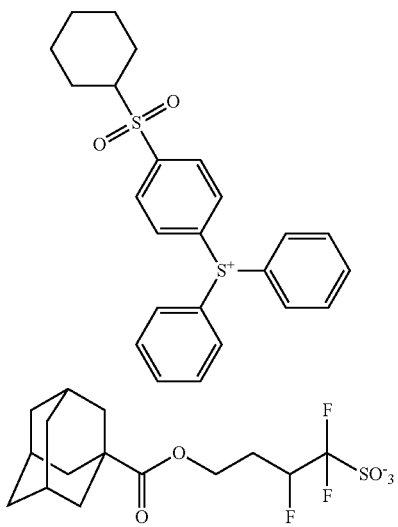
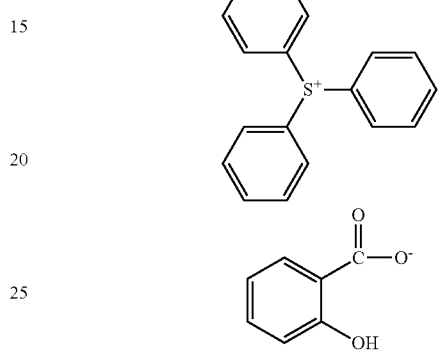

A-3: A compound represented by the following formula:

D-2: Tert-butyl-4-hydroxy-1-piperidine carboxylate represented by the following formula:

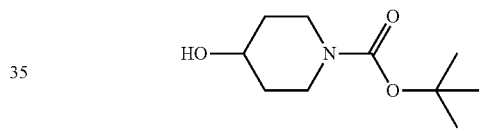

Solvent
E-1: Propylene glycol methyl ether acetate
E-2: Cyclohexanone
Lactone Compound
F-1: γ-Butyrolactone Preparation of Radiation-Sensitive Resin Composition Example 1

As the compound (A) 13 parts by mass of (A-1), as the polymer (B) 100 parts by mass of (B-1), as the polymer (C) 3 parts by mass of (C-1), as the diffusion controlling agent 13 parts by mass of (D-1), as the solvent 1,980 parts by mass of (E-1) and 848 parts by mass of (E-2), and as the lactone compound 200 parts by mass of (F-1) were blended, and each component was mixed to give a homogenous solution. Thereafter, the mixture was filtered through a membrane filter having a pore size of 0.2 μm to prepare a radiation-sensitive positive type resin composition having a total solid content of about 4%.

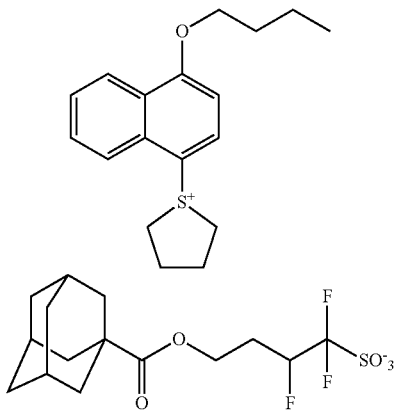

CA-1: Triphenylsulfonium 4-(1-adamantanecarbonyloxy)-1,1,2,2-tetrafluorobutanesulfonate represented by the following formula:

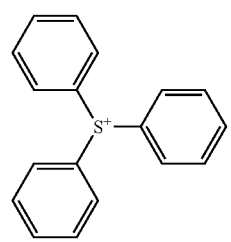

Examples 2 to 12 and Comparative Examples 1 to 8

Radiation-sensitive resin compositions were prepared by a similar operation to Example 1 except that each component of the type and the amount as shown in Table 1 was used. It is to be noted that "-" in Table 1 indicates that a corresponding component was not used.

Formation of Resist Pattern

A resist pattern was formed according to a method for forming a pattern (P-1) or (P-2) shown below using each radiation-sensitive resin composition prepared. The method for forming a pattern using each radiation-sensitive resin composition is shown together in Table 1.

Method for Forming a Pattern (P-1)

On a 12 inch silicon wafer on which an underlayer antireflection film ("ARC66", manufactured by Nissan Chemical Industries, Ltd.) was formed, was applied the radiation-sensitive resin composition, and post baking (PB) was carried out at a temperature shown in Table 1 for 60 sec to form a coating film having a film thickness of 75 nm. Next, the coating film was exposed through a mask pattern using an ArF excimer laser Immersion Scanner (NSR S610C, manufactured by Nikon Corporation), under a condition involving NA of 1.3, a ratio of 0.800, with "Annular". After the exposure, post-baking (PEB) was carried out at a temperature shown in Table 1 for 60 sec. Thereafter, development was carried out with a 2.38% by mass aqueous tetramethylammonium hydroxide solution, followed by washing with water and drying to form a positive type resist pattern.

Method for Forming a Pattern (P-2)

A coating film having a film thickness of 75 nm was formed by a similar operation to that in the method for forming a pattern (P-1). Next, a composition for forming an upper layer film described in Example 1 of WO2008/047678 was spin coated on the coating film, and PB was carried out at 90° C. for 60 sec to form a coating film (upper layer film) having a film thickness of 90 nm. This coating film was exposed through a mask pattern using the aforementioned ArF excimer laser Immersion Scanner under a similar condition. After the exposure, post-baking (PEB) was carried out at a temperature shown in Table 1 for 60 sec. Thereafter, development was carried out with a 2.38% by mass aqueous tetramethylammonium hydroxide solution, followed by washing with water and drying to form a positive type resist pattern.

Evaluation

The resist patterns formed as described above were evaluated on various types of physical properties as described below. The results are shown together in Table 1.

MEEF

An exposure dose at which a line-and-space (LS) pattern having a line width of 50 nm was formed by exposing through a 1 L/1 S mask pattern with a target size of 50 nm was defined as "optimal exposure dose". An LS pattern having a pitch of 100 nm was formed at this optimal exposure dose using each mask pattern with a target size of the line width of 46 nm, 48 nm, 50 nm, 52 nm or 54 nm, and the line width formed on the resist film was measured with an SEM for line-width measurement (CG4000, manufactured by Hitachi, Ltd.). In this procedure, the line width (nm) formed on the resist film using each mask pattern was plotted along the ordinate with respect to the target size (nm) along the abscissa, and the slope of the resulting straight line was determined as MEEF performance. The MEEF value (slope of the straight line) more approximate to 1 indicates more favorable mask reproducibility.

LWR (nm)

An exposure dose at which an LS pattern having a line width of 50 nm was formed by exposing through a 1.8 L/1 S mask pattern with a target size of 50 nm was defined as "optimal exposure dose". The LS pattern obtained at this optimal exposure dose was determined with the aforementioned SEM for line-width measurement. Line widths at arbitrary ten points were measured from above the pattern using the SEM for line-width measurement, and the variance of the measurements expressed as a value in terms of 3 sigma was defined as "LWR". When the LWR was no greater than 5.7, superior linearity of the pattern was suggested to decide that the LWR was favorable.

Minimum Collapse Dimension (nm)

The exposure was carried out through a 1 L/1.8 S mask pattern with a target size of 50 nm while changing the exposure dose by 1 mJ. The line width of the pattern formed at an exposure dose less than the exposure dose at which the line collapse occurred by 1 mJ was measured with the aforementioned SEM for line-width measurement. The line width measured was defined as a minimum collapse dimension. When the value of the minimum collapse dimension was no greater than 37, the pattern collapse resistance was decided to be favorable.

TABLE 1

| | (A) Component | | (B) Polymer | | (C) Polymer | | Acid diffusion controlling agent | | Lactone compound | | Solvent | |
|---|---|---|---|---|---|---|---|---|---|---|---|---|
| | type | parts by mass | type | parts by mass | type | parts by mass | type | parts by mass | type | parts by mass | type | parts by mass |
| Example 1 | A-1 | 13 | B-1 | 100 | C-1 | 3 | D-1 | 13 | F-1 | 200 | E-1/E-2 | 1,980/848 |
| Example 2 | A-1 | 12 | B-1 | 100 | C-1 | 3 | D-2 | 6 | F-1 | 200 | E-1/E-2 | 1,980/848 |
| Example 3 | A-1 | 13 | B-1 | 100 | — | — | D-1 | 13 | — | — | E-1/E-2 | 1,980/848 |
| Example 4 | A-1 | 12 | B-1 | 100 | — | — | D-2 | 6 | — | — | E-1/E-2 | 1,980/848 |
| Example 5 | A-1 | 13 | B-1 | 100 | C-1 | 3 | D-1 | 5 | F-1 | 200 | E-1/E-2 | 1,980/848 |
| Example 6 | A-1 | 12 | B-1 | 100 | C-1 | 3 | D-2 | 2 | F-1 | 200 | E-1/E-2 | 1,980/848 |
| Example 7 | A-2 | 13 | B-1 | 100 | C-1 | 3 | D-2 | 2 | F-1 | 200 | E-1/E-2 | 1,980/848 |
| Example 8 | A-3 | 13 | B-1 | 100 | C-1 | 3 | D-2 | 2 | F-1 | 200 | E-1/E-2 | 1,980/848 |
| Example 9 | A-1 | 13 | B-1 | 100 | — | — | D-1 | 5 | — | — | E-1/E-2 | 1,980/848 |
| Example 10 | A-1 | 12 | B-1 | 100 | — | — | D-2 | 2 | — | — | E-1/E-2 | 1,980/848 |
| Example 11 | A-2 | 13 | B-1 | 100 | — | — | D-2 | 2 | — | — | E-1/E-2 | 1,980/848 |
| Example 12 | A-3 | 13 | B-1 | 100 | — | — | D-2 | 2 | — | — | E-1/E-2 | 1,980/848 |
| Comparative Example 1 | CA-1 | 13 | B-1 | 100 | C-1 | 3 | D-1 | 13 | F-1 | 200 | E-1/E-2 | 1,980/848 |
| Comparative Example 2 | CA-1 | 12 | B-1 | 100 | C-1 | 3 | D-2 | 6 | F-1 | 200 | E-1/E-2 | 1,980/848 |
| Comparative Example 3 | CA-1 | 13 | B-1 | 100 | — | — | D-1 | 13 | — | — | E-1/E-2 | 1,980/848 |

TABLE 1-continued

| | | | | | | | | | | | |
|---|---|---|---|---|---|---|---|---|---|---|---|
| Comparative Example 4 | CA-1 | 12 | B-1 | 100 | — | — | D-2 | 6 | — | — | E-1/E-2 | 1,980/848 |
| Comparative Example 5 | CA-1 | 13 | B-1 | 100 | C-1 | 3 | D-1 | 5 | F-1 | 200 | E-1/E-2 | 1,980/848 |
| Comparative Example 6 | CA-1 | 12 | B-1 | 100 | C-1 | 3 | D-2 | 2 | F-1 | 200 | E-1/E-2 | 1,980/848 |
| Comparative Example 7 | CA-1 | 13 | B-1 | 100 | — | — | D-1 | 5 | — | — | E-1/E-2 | 1,980/848 |
| Comparative Example 8 | CA-1 | 12 | B-1 | 100 | — | — | D-2 | 2 | — | — | E-1/E-2 | 1,980/848 |

| | Pattern formation method | PB (° C.) | PEB (° C.) | MEEF | LWR (nm) | Minimum collapse dimension (nm) |
|---|---|---|---|---|---|---|
| Example 1 | p-1 | 120 | 85 | 3.4 | 4.9 | 36 |
| Example 2 | P-1 | 110 | 90 | 3.7 | 5.5 | 36 |
| Example 3 | P-2 | 120 | 85 | 3.4 | 4.8 | 35 |
| Example 4 | P-2 | 110 | 90 | 3.6 | 5.5 | 34 |
| Example 5 | P-1 | 120 | 85 | 3.4 | 5 | 36 |
| Example 6 | P-1 | 110 | 90 | 3.6 | 5.4 | 35 |
| Example 7 | P-1 | 110 | 90 | 3.6 | 5.5 | 35 |
| Example 8 | P-1 | 110 | 85 | 3.7 | 5.7 | 37 |
| Example 9 | P-2 | 120 | 85 | 3.5 | 4.7 | 34 |
| Example 10 | P-2 | 110 | 90 | 3.6 | 5.6 | 34 |
| Example 11 | P-2 | 110 | 90 | 3.5 | 5.5 | 35 |
| Example 12 | P-2 | 110 | 85 | 3.6 | 5.5 | 36 |
| Comparative Example 1 | P-1 | 120 | 85 | 3.5 | 5.4 | 39 |
| Comparative Example 2 | P-1 | 110 | 90 | 3.7 | 6 | 39 |
| Comparative Example 3 | P-2 | 120 | 85 | 3.4 | 5.7 | 39 |
| Comparative Example 4 | P-2 | 110 | 90 | 3.6 | 6 | 38 |
| Comparative Example 5 | P-1 | 120 | 85 | 3.6 | 5.6 | 39 |
| Comparative Example 6 | P-1 | 110 | 90 | 3.7 | 6.1 | 39 |
| Comparative Example 7 | P-2 | 120 | 85 | 3.6 | 5.8 | 40 |
| Comparative Example 8 | P-2 | 110 | 90 | 3.5 | 5.9 | 39 |

As is clear from the results shown in Table 1, it was revealed that the resist pattern formed from the radiation-sensitive resin composition is excellent in resistance to pattern collapse and LWR, and also has satisfactory balance with MEEF.

According to the embodiment of the present invention, a radiation-sensitive resin composition having well balanced LWR and MEEF, and resistance to pattern collapse after the development can be provided. Therefore, the radiation-sensitive resin composition can be suitably used as a chemically amplified resist useful in microfabrication in which a radioactive ray, e.g., a far ultraviolet ray such as a KrF excimer laser or an ArF excimer laser, an X-ray such as a synchrotron radioactive ray, a charged particle-ray such as an electron beam is used.

Obviously, numerous modifications and variations of the present invention are possible in light of the above teachings. It is therefore to be understood that within the scope of the appended claims, the invention may be practiced otherwise than as specifically described herein.

What is claimed is:

1. A radiation-sensitive resin composition comprising:
   a compound represented by formula (1); and
   a first polymer that serves as a base resin,

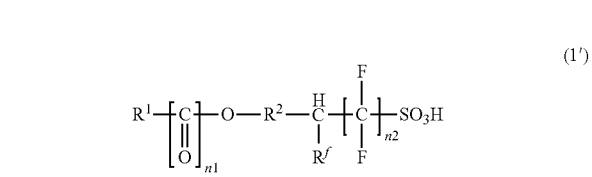

(1')

wherein in the formula (1),
   R represents an alkyl group having 1 to 20 carbon atoms, a monovalent alicyclic hydrocarbon group having 3 to 20 carbon atoms, an aryl group having 6 to 15 carbon atoms or a heteroaryl group having 4 to 15 carbon atoms;
   $R^2$ represents an ether group, an ester group, a carbonyl group, a bivalent chain hydrocarbon group having 1 to 30 carbon atoms, a bivalent cyclic hydrocarbon group having 3 to 30 carbon atoms, a bivalent aromatic hydrocarbon group having 6 to 30 carbon group or a group derived by combining two or more thereof;
   $R^f$ represents a fluorine atom;
   $M^+$ represents a monovalent cation;
   n1 is 0 or 1; and
   n2 is 1.

2. The radiation-sensitive resin composition according to claim 1, wherein $R^1$ represents a monovalent alicyclic hydrocarbon group having 3 to 20 carbon atoms.

3. The radiation-sensitive resin composition according to claim 1, wherein $M^+$ represents a sulfonium cation or an iodonium cation.

4. The radiation-sensitive resin composition according to claim 1, wherein the first polymer is insoluble or hardly soluble in alkali, the first polymer comprising:
a structure unit represented by formula (5) or a structure unit represented by formula (6); and
a structure unit represented by formula (7),

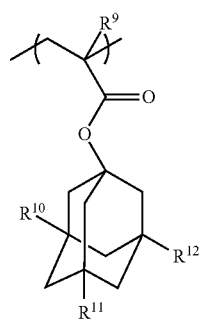

(5)

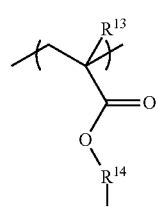

(6)

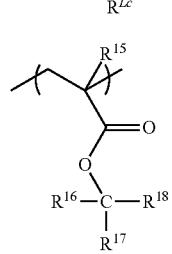

(7)

wherein in the formula (5), formula (6) and formula (7),
$R^9$, $R^{13}$ and $R^{15}$ each independently represent a hydrogen atom or a methyl group, wherein in the formula (5),
$R^{10}$, $R^{11}$ and $R^{12}$ each independently represent a hydrogen atom, a hydroxyl group, a cyano group or —COOR$^{19}$; and
$R^{19}$ represents a hydrogen atom, a linear or branched alkyl group having 1 to 4 carbon atoms, or a cycloalkyl group having 3 to 20 carbon atoms,
wherein in the formula (6),
$R^{14}$ represents a single bond or a bivalent linking group; and
$R^{Lc}$ represents a monovalent organic group having a lactone structure, and wherein in the formula (7),
$R^{16}$, $R^{17}$ and $R^{18}$ each independently represent a monovalent alicyclic hydrocarbon group having 4 to 20 carbon atoms or a derivative thereof, or a linear or branched alkyl group having 1 to 4 carbon atoms, wherein at least one group of $R^{16}$, $R^{17}$ and $R^{18}$ represents an alicyclic hydrocarbon group having 4 to 20 carbon atoms or a derivative thereof, or two groups of $R^{16}$, $R^{17}$ and $R^{18}$ taken together represent a bivalent alicyclic hydrocarbon group having 4 to 20 carbon atoms or a derivative thereof together with the carbon atom to which the two groups are each attached.

5. The radiation-sensitive resin composition according to claim 1, further comprising a second polymer having a content of fluorine atoms greater than a content of fluorine atoms of the first polymer.

6. The radiation-sensitive resin composition according to claim 1, wherein in the formula (1), $R^1$ represents a cyclopentyl group, a cyclohexyl group, a cycloheptyl group, a 2-norbornyl group, a 1-adamantyl group, or a 2-adamantyl group.

7. The radiation-sensitive resin composition according to claim 1, wherein in the formula (1), $R^1$ represents a cyclohexyl group or a 1-adamantyl group.

8. The radiation-sensitive resin composition according to claim 1, further comprising an acid diffusion control agent represented by a formula: $X^+Z^-$, wherein
$X^+$ is a cation represented by a formula (19) or a formula (20);
$Z^-$ is OH$^-$, an anion represented by a formula of $R^{75}$—COO$^-$, or an anion represented by a formula of $R^{75}$—SO$_3^{31}$; and
$R^{75}$ represents an alkyl group, an alicyclic hydrocarbon group, or an aryl group, wherein, a part or all of hydrogen atoms of the alkyl group, the alicyclic hydrocarbon group, or the aryl group are substituted or not substituted:

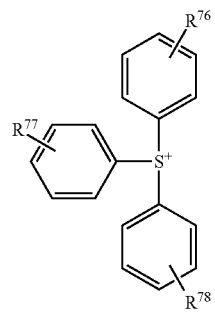

(19)

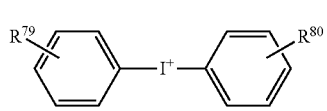

(20)

wherein in the formula (19),
$R^{76}$ to $R^{78}$ each independently represent a hydrogen atom, an alkyl group, an alkoxyl group, a hydroxyl group or a halogen atom, and
wherein in the formula (20),
$R^{79}$ and $R^{80}$ each independently represent a hydrogen atom, an alkyl group, an alkoxyl group, a hydroxyl group or a halogen atom.

9. The radiation-sensitive resin composition according to claim 8, wherein $Z^{31}$ is OH $^-$or the anion represented by the formula of: $R^{75}$—COO$^-$.

10. The radiation-sensitive resin composition according to claim 8, wherein $Z^{31}$ is an anion represented by a formula:

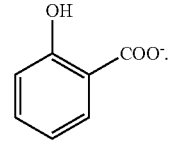

11. The radiation-sensitive resin composition according to claim 8, wherein $Z^{31}$ is an anion represented by a formula:

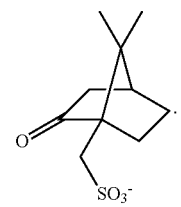

* * * * *